(12) United States Patent
Hayashi

(10) Patent No.: US 10,535,831 B2
(45) Date of Patent: Jan. 14, 2020

(54) ILLUMINATION SYSTEM AND PLANAR LIGHT SOURCE

(71) Applicant: KANEKA CORPORATION, Osaka-shi, Osaka (JP)

(72) Inventor: Katsuhiko Hayashi, Osaka (JP)

(73) Assignee: KANEKA CORPORATION, Osaka-shi, Osaka (JP)

( * ) Notice: Subject to any disclaimer, the term of this patent is extended or adjusted under 35 U.S.C. 154(b) by 0 days.

(21) Appl. No.: 15/769,320

(22) PCT Filed: Oct. 6, 2016

(86) PCT No.: PCT/JP2016/079841
§ 371 (c)(1),
(2) Date: Apr. 18, 2018

(87) PCT Pub. No.: WO2017/104239
PCT Pub. Date: Jun. 22, 2017

(65) Prior Publication Data
US 2018/0309083 A1    Oct. 25, 2018

(30) Foreign Application Priority Data
Dec. 17, 2015  (JP) .................. 2015-246135

(51) Int. Cl.
*H01L 51/52* (2006.01)
*H01L 51/50* (2006.01)
(Continued)

(52) U.S. Cl.
CPC ............ *H01L 51/5203* (2013.01); *F21S 2/00* (2013.01); *F21S 8/038* (2013.01); *F21V 19/0015* (2013.01);
(Continued)

(58) Field of Classification Search
CPC . H01L 51/50; H01L 51/5203; H01L 25/0753; F21S 2/00; F21S 8/033;
(Continued)

(56) References Cited

U.S. PATENT DOCUMENTS 5,844,362 A   12/1998  Tanabe et al.
5,950,808 A    9/1999  Tanabe et al.
(Continued)

FOREIGN PATENT DOCUMENTS

| JP | H09035571 A | 2/1997 |
| JP | 2013168531 A | 8/2013 |
| JP | 2015138576 A | 7/2015 |

OTHER PUBLICATIONS

ISA Japan Patent Office, International Search Report Issued in PCT Application No. PCT/JP2016/079841, dated Dec. 20, 2016, WIPO, 2 pages.
(Continued)

*Primary Examiner* — Mohammed Shamsuzzaman
*Assistant Examiner* — Aaron J Gray
(74) *Attorney, Agent, or Firm* — Alleman Hall Creasman & Tuttle LLP

(57) ABSTRACT

A planar light source emits planar light by power supplied from a mounting member. The planar light source includes an engaging part, a planar-light-emitting panel having a light-emitting surface, and a connecting unit disposed between the engaging part and the planar-light-emitting panel. The engaging part forms a portion of a power supply path for supplying power from the mounting member to the planar-light-emitting panel. The planar-light-emitting panel includes a planar-light-emitting tile and a translucent plate, where one main surface of the planar-light-emitting tile includes a light-emitting region. The planar-light-emitting panel emits, in a lighting state, the planar light from the
(Continued)

light-emitting region of the planar-light-emitting tile through the translucent plate. An output of the planar light from the planar light source is adjusted by pressing the light-emitting surface.

7 Claims, 18 Drawing Sheets

(51) Int. Cl.
    *H01L 25/075*      (2006.01)
    *F21V 23/04*      (2006.01)
    *F21V 21/35*      (2006.01)
    *F21V 21/34*      (2006.01)
    *F21S 8/00*      (2006.01)
    *F21S 2/00*      (2016.01)
    *H01H 13/02*      (2006.01)
    *F21V 19/00*      (2006.01)
    *F21Y 115/15*      (2016.01)

(52) U.S. Cl.
    CPC .............. *F21V 21/34* (2013.01); *F21V 21/35* (2013.01); *F21V 23/04* (2013.01); *H01L 25/0753* (2013.01); *H01L 51/50* (2013.01); *F21Y 2115/15* (2016.08); *H01H 13/023* (2013.01)

(58) Field of Classification Search
    CPC ..... F21S 8/036; F21S 4/20; F21S 4/28; F21V 23/04; F21V 23/06; F21V 19/0015; F21V 19/003; F21V 19/002; F21V 19/0025; F21V 19/004; F21V 19/0045; F21V 19/0055; F21V 21/005; F21V 21/14; F21V 21/34; F21V 21/35
    USPC ..... 200/314; 362/249.05; 257/40, 88, 91, 99
    See application file for complete search history.

(56) References Cited

U.S. PATENT DOCUMENTS

| | | | |
|---|---|---|---|
| 2005/0116667 A1* | 6/2005 | Mueller | E04F 13/08 315/312 |
| 2009/0107817 A1* | 4/2009 | Onuki | H01H 13/023 200/314 |
| 2010/0157585 A1* | 6/2010 | Diekmann | F21S 6/002 362/228 |
| 2011/0180377 A1* | 7/2011 | Liao | H01H 13/023 200/314 |
| 2014/0111094 A1* | 4/2014 | Kodama | H05B 33/08 315/129 |
| 2016/0363304 A1* | 12/2016 | Omata | G06F 3/044 |

OTHER PUBLICATIONS

International Bureau of WIPO, International Preliminary Report on Patentability Issued in Application No. PCT/JP2016/079841, dated Jun. 19, 2018, WIPO, 5 pages.

\* cited by examiner

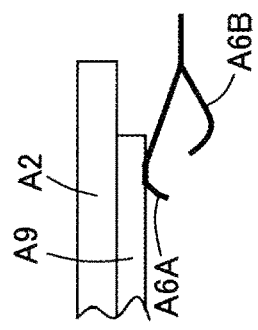 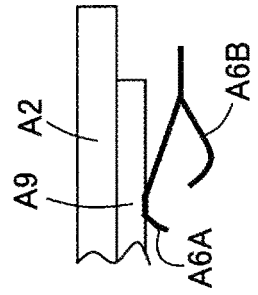 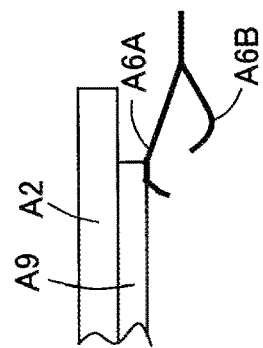 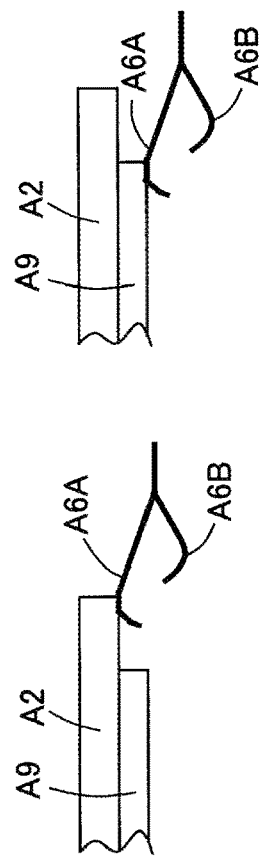
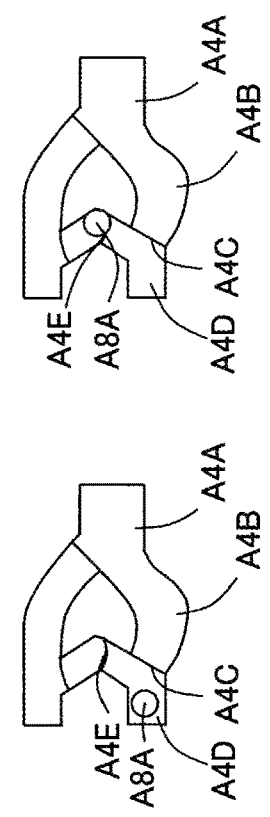 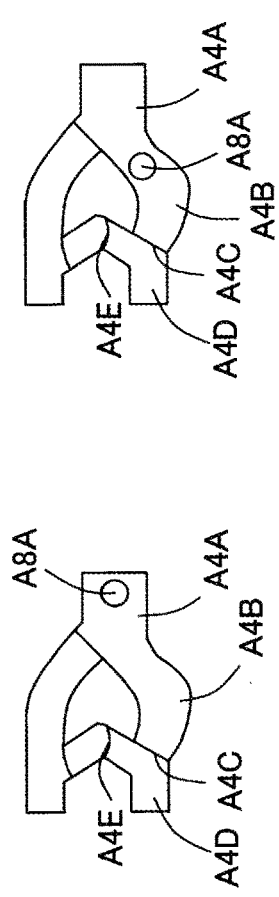
FIG. 17A  FIG. 17B  FIG. 17C  FIG. 17D

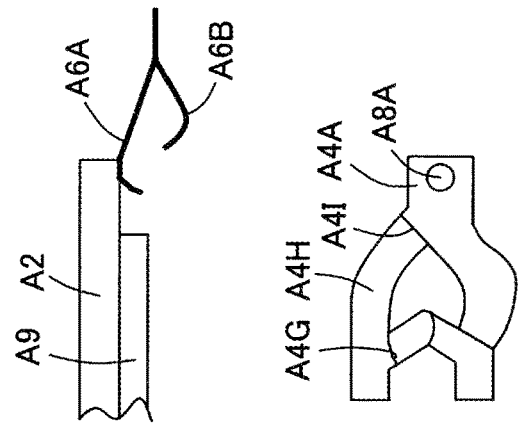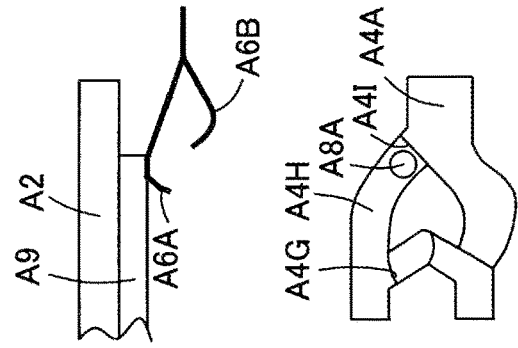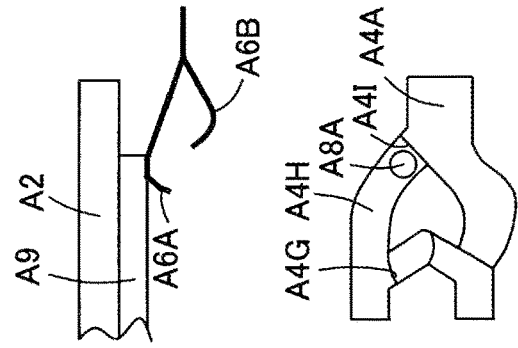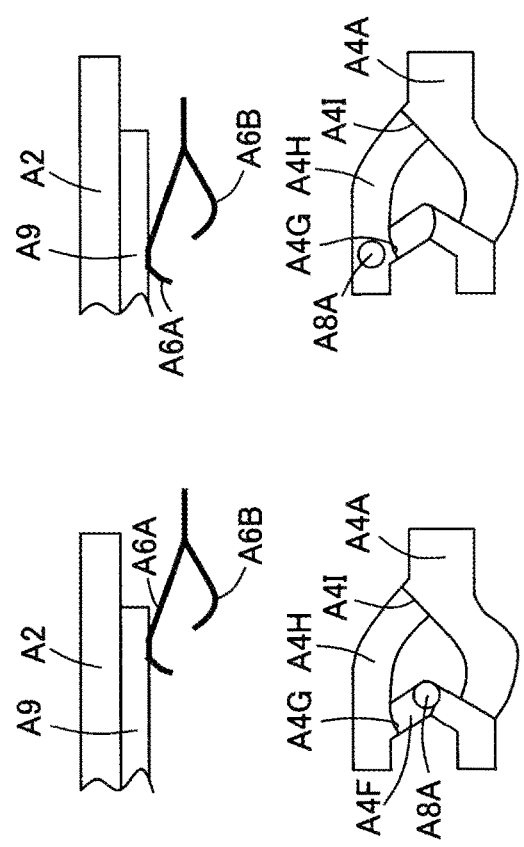

ILLUMINATION SYSTEM AND PLANAR LIGHT SOURCE

TECHNICAL FIELD

The present invention relates to a lighting system and a planar light source. The present invention relates in particular to a lighting system in which an output of planar light is adjusted by pressing a light-emitting surface.

BACKGROUND ART

In recent years, planar-light-emitting panels, represented by organic EL panels, have much been considered as light sources that substitute for incandescent lamps and fluorescent lamps. Much research on the planar-light-emitting panels has been made.

The organic EL panel includes an organic EL tile housed in a housing, such as a bezel (frame, case), or held on a translucent plate, and the organic EL tile includes an organic EL element, which is small in thickness and emits planer light, formed on a translucent substrate.

The organic EL tile is constituted by an organic EL element that forms an anode layer, a cathode layer opposing the anode layer, and an organic EL element therebetween on a base material, such as a glass substrate, a transparent resin film, and a transparent metal sheet. Hereupon one or both of the anode layer and the cathode layer are translucent, and the organic EL element is composed of laminated organic functional layers. Generally, in the organic EL tile, the organic EL element described above is sealed in a sealing glass cap having a recess, or sealed by a sealing film formed on the organic EL element. The sealing film is formed of, for example, an inorganic insulating film such as oxidized and/or nitrided silicon, or an organic insulating film such as an acrylic insulating film.

When power is supplied across the electrode layers, electrically excited electrons and positive holes in the organic EL element recombine and the organic EL tile emits light. The organic EL tile is small in thickness, and emits planar light.

Since the planar-light-emitting tiles, which are represented by the organic EL tile described above, an LED tile including a planar-light-emitting element of LEDs arranged on a plane, and an LED combined with a diffusion plate, emit planar light, they are used as a planar light source.

To use the planar-light-emitting tile as a light source, an external power source or the like is connected to the tile, and a printed circuit board (PCB) such as a flexible printed circuit (FPC) and a rigid printed circuit (RPC) is used to supply power to the planar-light-emitting element.

A mounting structure disclosed in Patent Document 1 is a structure for mounting such a planar-light-emitting panel on a wall or the like.

The mounting structure disclosed in Patent Document 1 includes a mounting device for electrically connecting a commercial power source to an organic EL panel. The mounting device includes a base portion attached to a surface opposite the organic EL panel that constitutes a ceiling plate, and a connector portion engageable with a power supply portion of the organic EL panel. In the mounting structure disclosed in Patent Document 1, the power supply portion of the organic EL panel engages with the connector portion of the mounting device to be held in a mounting position that is supported by the ceiling plate.

PRIOR ART DOCUMENT

Patent Document

Patent Document 1: JP 2013-168531 A

DISCLOSURE OF INVENTION

Technical Problem

The mounting structure disclosed in Patent Document 1 has a structure that utilizes the feature of a planar-light-emitting panel that is small in thickness and emits planar light. The mounting structure effectively enables installation with excellent appearance, even in a narrow place.

The mounting structure disclosed in Patent Document 1 however needs a base portion provided on a back surface of an interior member, such as a wall member and a ceiling member, the back surface being opposite the surface where the panel is installed. Providing the base portion disadvantageously requires work and cost.

In addition, when replacing the panel due to a failure or the like is needed, a force needs to be applied to the panel to detach the panel from the connector portion. Care should be taken not to damage the panel when the panel is detached or attached.

Furthermore, in order to allow turning on and off independently for each of a large number of panels arranged using the mounting structure disclosed in Patent Document 1, adjustment of the relation between switches and panel arrangement and adjustment of output or the like of each panel become disadvantageously complex.

The present invention is made to solve the aforementioned problem of the prior art. An object of the present invention is to provide a lighting system and a planar light source that provide an easy switch operation for adjusting an output of planar light.

Solution to Problem

One aspect of the present invention for solving the aforementioned problem is a lighting system including: a mounting member attachable to a mounting surface; and a planar light source detachably attached to the mounting member, the planar light source being supplied with power from the mounting member to emit planar light, wherein the planar light source includes: an engaging part engageable with a portion of the mounting member; a planar-light-emitting panel having a light-emitting surface that emits the planar light; and a connecting unit disposed between the engaging part and the planar-light-emitting panel, the engaging part constituting a portion of a power supply path for supplying power from the mounting member to the planar-light-emitting panel, the planar-light-emitting panel including a planar-light-emitting tile and a translucent plate that protects the planar-light-emitting tile, one main surface of the planar-light-emitting tile including a light-emitting region, wherein the planar-light-emitting panel, in a lighting state, emits the planar light from the light-emitting region of the planar-light-emitting tile through the translucent plate, and wherein an output of the planar light from the planar light source is adjusted by pushing the light-emitting surface.

The "mounting surface" as used herein is a surface where the lighting system is mounted, for example, a ceiling, a wall, a floor, and a wall surface of a fixed structure.

"Adjusting the output of the planar light" as used herein means to adjust the output of the planar light in a stepwise or non-stepwise manner.

According to the aspect, the mounting member is attached to the mounting surface and the planar light source is detachably attached to the mounting member, and therefore a base portion is not needed to be provided on the back surface of the interior member as in Patent Document 1. This enables the panel to be installed easily with low cost.

According to the aspect, the translucent plate is provided in the direction in which the light is emitted from the light-emitting region of the planar-light-emitting panel. Thus, the planar-light-emitting panel is protected from a pressing force given to the light-emitting surface by a user, thereby preventing a load locally applied to the planar-light-emitting panel. Consequently, the planar-light-emitting panel is less likely to be damaged by the pressing force applied to the light-emitting surface by a press given by a user.

According to the aspect, the translucent plate reinforces the planar-light-emitting tile to increase rigidity. This reduces the chances of an excessive load being applied to the planar-light-emitting tile during replacement of the planar-light-emitting tile. Thus, damage to the planar-light-emitting panel is prevented, even for a tile small in thickness, so that the planar-light-emitting panel can safely be replaced.

According to the aspect, an output of planar light is adjusted by pressing the light-emitting surface. The lighting system is thus configured to be free of complexity of adjusting the relation between the switches and panel arrangement and allows switch operations, such as turning on and off the panel and dimming, even for a case in which a plurality of panels is arranged.

Meanwhile, in recent years, a duct rail has widely been used as a member that supports a lighting member and also supplies power to the lighting member. The duct rail can supply power to the mounted lighting member and allows moving the lighting member along the longitudinal direction to change the mounting position of the lighting member. The duct rail has popularly been used in shops to support and supply power to a lighting member, such as a pendant light and a spot light, for attractively presenting products. Moreover, the duct rail has now been introduced into standard households.

Such a duct rail is also referred to as, for example, a lighting rail (registered trademark), a lighting duct, a power supply duct, a slide outlet, and is standardized as JIS C 8366. A lighting member which complies with the standard of the lighting duct called a plug type can directly be mounted on the duct rail. A hook ceiling for a lighting duct (an attachment for hanging and lighting a pendant lighting member or the like) and an outlet plug member or the like can also be mounted on the duct rail.

A preferable aspect is that the mounting member includes a duct rail extending in a predetermined direction, and that the planar light source, in a state attached to the mounting member, is movable in an extending direction of the duct rail.

According to the aspect, the lighting system is configured to supply power to the panel and support the planar light source by the duct rail. In the lighting system, the planar light source supported by the duct rail is movable in the extending direction (longitudinal direction) of the duct rail, and thus adjustment of the attaching position (mounting position) of the planar light source in the longitudinal direction is easy.

In addition, according to the aspect, a totally stylish and familiar lighting system can be provided.

A preferable aspect of the planar-light-emitting panel is that switching between the lighting state and a non-lighting state of the planar-light-emitting panel is made by pressing the light-emitting surface.

According to the aspect, a user turns on and off easily by enabling switching between the lighting state and the non-lighting state by pressing the light-emitting surface.

In a preferred aspect, the mounting surface includes at least a vertical direction component, the mounting member includes at least two duct rails extending in the predetermined direction, the two duct rails are fixed to the mounting surface parallel to each other, the planar light source includes a first detachable portion detachable from one of the two duct rails and a second detachable portion detachable from the other of the two duct rails, and the first detachable portion is the engaging part.

According to the aspect, the first detachable portion is an engaging part forming a portion of a power supply path for feeding power from the mounting member to the planar-light-emitting panel, so that the power supply path is formed by attaching the detachable portion, which makes it easy to supply power to the planar-light-emitting panel.

According to the aspect, the planar light source is supported by the two duct rails, so that the planar light source is attached and supported in a further stable manner and also can be attached and detached repetitively without damage.

In a preferred aspect, the mounting surface includes a vertical direction component, the mounting member includes at least two duct rails extending in the predetermined direction, the two duct rails are fixed to the mounting surface parallel to each other, the planar light source includes a first detachable portion detachable from one of the two duct rails and a second detachable portion detachable from the other of the two duct rails, and the first detachable portion and the second detachable portion constitute the engaging part.

According to the aspect, the detachable portions which are detachable from the two duct rails are engaging parts each forming a portion of the power supply path for supplying power from the mounting member to the planar-light-emitting panel. This enables safer power supply to the planar-light-emitting panel by, for example, using the detachable portion attached to one of the duct rails to form a power supply path connected to the anode electrode terminal and using the detachable portion attached to the other duct rail to form a power supply path connected to the cathode electrode terminal.

According to the aspect, the planar light source is supported by the two duct rails, so that the planar light source is attached and supported in a further stable manner and also can be attached and detached repetitively without damage.

In a preferable aspect, the light-emitting surface has, in the non-lighting state, appearance of a mirror surface.

According the aspect, the light-emitting surface has appearance of a mirror surface, when the light emission is turned off (in the non-lighting state), and can be used as a mirror. This configuration is thus superior in functionality and design to conventional lighting.

In a preferable aspect, the connecting unit includes a push switch member, the push switch member including a pair of switch mechanisms, the pair of switch mechanisms being disposed to oppose to each other, the pair of switch mechanisms being disposed in a direction perpendicular to the light-emitting surface, and the pair of switch mechanisms are electrically connected in the lighting state and are electrically disconnected in a non-lighting state.

According to the aspect, the light-emitting surface can also serve as a push switch to be operated, which allows even a push switch surface with a large area, unlike a normal switch, to stably be operated.

In a more preferable aspect, the push switch member is capable of an alternate-action, such as the planar light source is brought into the lighting state or the non-lighting state by giving a predetermined pressing force to the light-emitting surface and keeps the lighting state or the non-lighting state after releasing the pressing force.

The "predetermined lighting state" referred to herein means one form of lighting state such as full lighting or half-lighting.

According to the aspect, the switch is of an alternate-action type, which enables changing the state to a predetermined different lighting state or non-lighting state by simply pressing the switch once and keeping the predetermined lighting state or non-lighting state.

In a preferable aspect, the connecting unit includes a protective member and a push switch member, the protective member being disposed closer to the planar-light-emitting panel, the protective member protects an other main surface of the planar-light-emitting tile, the protective member including two movable contact plates that oppose to each other and that are perpendicular to the light-emitting surface, the two movable contact plates extend with a vertical direction component, and the two movable contact plates are both fitted in the push switch member in the lighting state.

According to the aspect, in the lighting state, the push switch member moves while keeping its posture by being held between the two movable contact plates, so that the planar light source can be supported in a further stable manner.

In a preferable aspect, the planar-light-emitting panel is an organic EL panel including an organic EL element in which an organic light-emitting layer is disposed between two opposing electrode layers.

According to the aspect, the planar-light-emitting panel is an organic EL panel that is small in thickness and light-weight, so that events such as falling are not likely to happen.

An aspect of the present invention provides a planar light source that is detachable from a mounting member attached to a mounting surface, and emits planar light by power supplied from the mounting member in a state attached to the mounting member, the planar light source including: an engaging part engageable with a portion of the mounting member; a planar-light-emitting panel having a light-emitting surface that emits the planar light; and a connecting unit disposed between the engaging part and the planar-light-emitting panel, the engaging part constituting a portion of a power supply path for supplying power from the mounting member to the planar-light-emitting panel, the planar-light-emitting panel including a translucent plate and a planar-light-emitting tile, one main surface of the planar-light-emitting tile including a light-emitting region, wherein the planar-light-emitting panel, in a lighting state, emits the planar light from the light-emitting region of the planar-light-emitting tile through the translucent plate, and wherein an output of the planar light is adjusted by pushing the light-emitting surface.

According to the aspect, a base portion is not needed to be provided on the back surface of the interior member as in Patent Document 1, so that the panel can be installed easily with low cost.

According to the aspect, the planar-light-emitting panel is protected from pressing given to the light-emitting surface by a user, thereby preventing a load being locally applied to the planer-light-emitting panel. Thus, damage to the planar-light-emitting panel caused by a pressing force applied to the light-emitting surface by a pressing operation given by a user is not likely to happen.

According to the aspect, the chances of an excessive load being applied to the planar-light-emitting tile during replacement of the planar-light-emitting tile are reduced. Thus, damage to the planar-light-emitting panel is prevented, even for a tile small in thickness, so that the planar-light-emitting panel can safely be replaced.

According to the aspect, the lighting system is configured to be free of complexity of adjusting the relation between the switches and panel arrangement and allows switch operations, such as turning on and off the panel and dimming, even for a case in which a plurality of panels is arranged.

An aspect of the present invention is a planar light source including a pair of detachable portions detachable from a pair of duct rails, the planar light source including a planar-light-emitting panel including a light-emitting surface, wherein the planar-light-emitting panel includes: a translucent plate; a planar-light-emitting tile; and a connecting unit disposed between the detachable portion and the planar-light-emitting tile, wherein one main surface of the planar-light-emitting tile includes a light-emitting region whereas the other main surface has at least two types of electrode terminals, wherein the connecting unit includes a protective member and a push switch member, the protective member being disposed closer to the planar-light-emitting panel, the connecting unit being electrically connected to the two types of electrode terminals, wherein the protective member protects the other main surface of the planar-light-emitting tile, wherein one of the pair of detachable portions is an engaging part engageable with a portion of one of the pair of duct rails, wherein the engaging part is electrically connected to the connecting unit, wherein power is supplied from one of the duct rails to the planar-light-emitting panel via the engaging part in a state where the pair of detachable portions are attached to the pair of duct rails, wherein the planar-light-emitting panel emits, in a lighting state, the planar light from the light-emitting region of the planar-light-emitting tile through the translucent plate, and wherein an output of the planar light is adjusted by pressing the light-emitting surface.

According to the aspect, a base portion is not needed to be provided on the back surface of the interior member as in Patent Document 1, so that the panel can be installed easily with low cost.

According to the aspect, the planar-light-emitting panel is protected from pressing given to the light-emitting surface by a user, thereby preventing a load being locally applied to the planer-light-emitting panel. Thus, damage to the planar-light-emitting panel caused by a pressing force applied to the light-emitting surface by a pressing operation given by a user is not likely to happen.

According to the aspect, the chances of an excessive load being applied to the planar-light-emitting tile during replacement of the planar-light-emitting tile are reduced. Thus, damage to the planar-light-emitting panel is prevented, even for a tile small in thickness, so that the planar-light-emitting panel can safely be replaced.

According to the aspect, the lighting system is configured to be free of complexity of adjusting the relation between the switches and panel arrangement and allows switch operations, such as turning on and off the panel and dimming, even for a case in which a plurality of panels is arranged.

According to the aspect, safer power is supplied to the planar-light-emitting panel by, for example, using the detachable portion attached to one of the duct rails to form a power supply path connected to the anode electrode terminal and using the detachable portion attached to the other duct rail to form a power supply path connected to the cathode electrode terminal.

According to the aspect, the planar light source is attached and supported in a further stable manner and also can be attached and detached repetitively without damage.

Effect of Invention

A lighting system and a planar light source of the present invention provide an easy switch operation for adjusting an output of planar light.

BRIEF DESCRIPTION OF DRAWINGS

FIGS. 10A and 10B are explanatory views of a heart cam groove in FIG. 9, wherein FIG. 10A is a perspective view illustrating the vicinity of the heart cam groove, and FIG. 10B is a plan view of the heart cam groove.

FIGS. 13A and 13B are transparent sectional views for explaining an operating mechanism of the push switch member in FIG. 3, wherein FIG. 13A illustrates an OFF state, and FIG. 13B illustrates an ON state. The transparent sectional views are taken along Y-Y' plane in FIGS. 14A and 14B.

FIGS. 14A and 14B are transparent sectional views taken along X-X' plane in FIGS. 13A and 13B for explaining the operating mechanism of the push switch member illustrated in FIGS. 13A and 13B, wherein FIG. 14A illustrates the OFF state, and FIG. 14B illustrates the ON state.

FIGS. 16A and 16B are explanatory views illustrating the planar light source in FIG. 1 to be engaged with the duct rail, wherein FIG. 16A is a perspective view illustrating the non-engaged state, and FIG. 16B is a perspective view illustrating the engaged state.

FIGS. 17A to 17D are explanatory views of an ON-motion of the lighting system in FIG. 1. FIGS. 17A to 17D illustrate the positional relationship among main parts of the push switch member in a chronological order.

FIGS. 18A to 18D are explanatory views of an OFF-motion of the lighting system in FIG. 1. FIGS. 18A to 18D illustrate the positional relationship among the main parts of the push switch member in a chronological order.

BEST MODE FOR CARRYING OUT THE INVENTION

Hereinafter, embodiments of the present invention will be described with reference to the drawings. In the following description, unless otherwise specified, the positional relationship regarding the upper side, the lower side, the left side, and the right side will be explained based on the normally installed position as in FIG. 1. The side to a duct rail 40 is the front side, and the side to an installation space 101 is the rear side.

(Lighting System 100)

Figure 1:
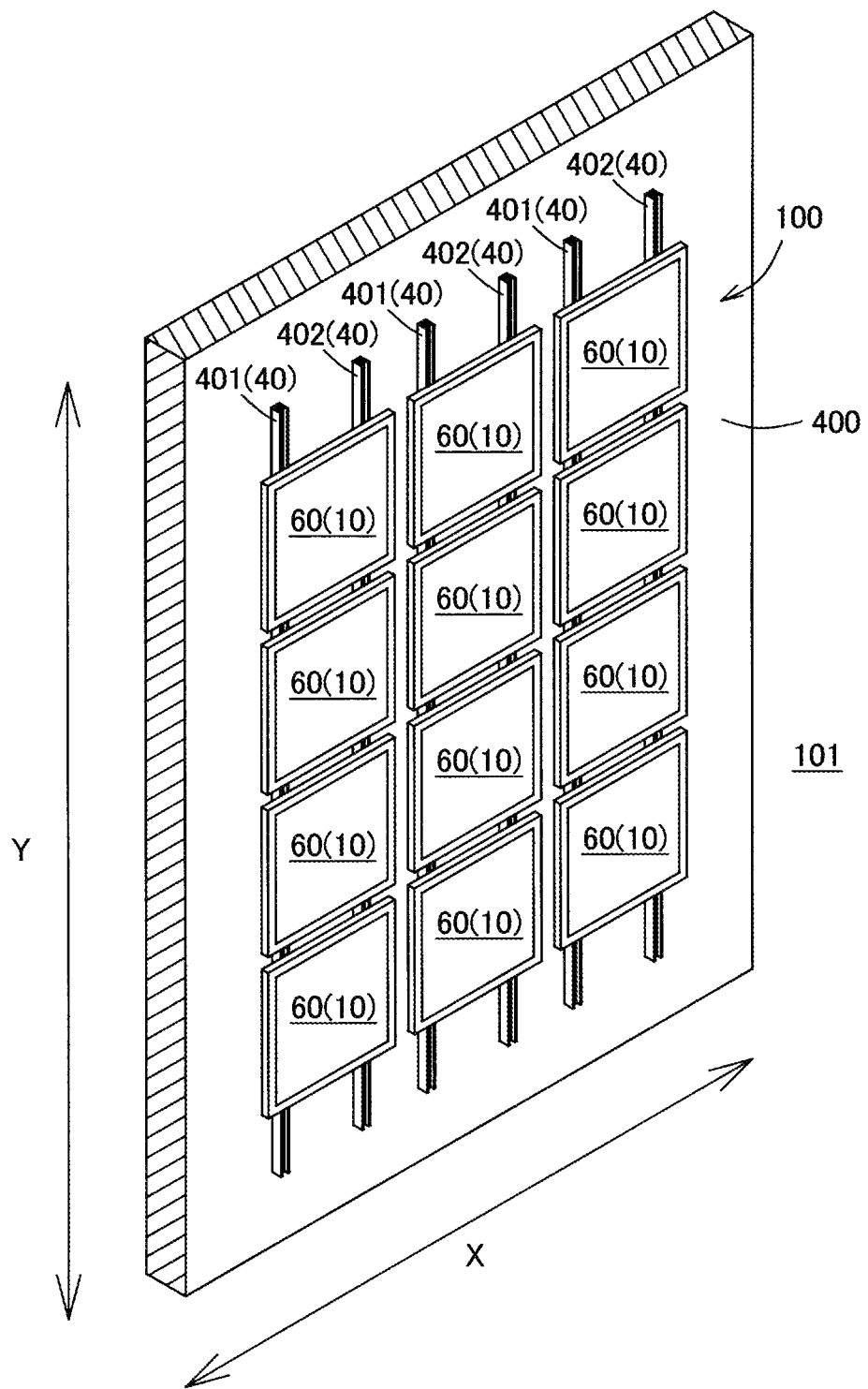
FIG. 1 is a perspective view schematically illustrating a lighting system in use according to a first embodiment of the present invention.

As illustrated in FIG. 1, a lighting system 100 according to a first embodiment of the present invention is a planar lighting system that is mounted on a mounting surface 400, such as a wall, and illuminates the installation space 101.

The lighting system 100 includes the duct rail 40 (mounting member) and a planar-light-emitting light source 10 (hereinafter also simply referred to as a planar light source 10). The planar light source 10 is attached to the duct rail 40. The planar light source 10 is supplied with power from the duct rail 40 to emit planar light.

That is, the lighting system 100 is capable of emitting, to the installation space 101, the illumination light in the direction from the duct rail 40 to the planar light source 10 (rearward) from a light-emitting surface 20 of a planar-light-emitting panel 60 (hereinafter also simply referred to as a planar panel 60) included in the planar light source 10.

The planar light source 10 includes an engaging part 4 that can engage with and disengage from the duct rail 40. One of the characteristics of the lighting system 100 is that the engaging part 4 is detachable from the duct rail 40. That is, the lighting system 100 can be attached and detached by engagement between the duct rail 40 and the engaging part 4.

The planar light source 10 includes a power supply path from the duct rail 40 to a planar-light-emitting element 1 (see FIG. 3) included in the planar light source 10, and the engaging part 4 includes a portion of the power supply path for supplying power from the duct rail 40 to the planar-light-emitting element 1.

The lighting system 100 is a light-emitting surface push switch lighting system having the light-emitting surface 20 of the planar light source 10 that serves as an operation surface for adjusting the output of planar light. That is, the light-emitting surface 20 of the planar light source 10 is a surface from which the planar illumination light is emitted, and also is a push switch surface used for turning on and off, dimming, and toning of the light.

As described above, one of the characteristics of the lighting system 100 of the embodiment is that the light-emitting surface 20 of the planar light source 10 not only serves as the surface that emits illumination light but also as a push switch surface of a push switch member 342 (see FIG. 3) related to ON/OFF of light emission.

That is, the lighting system 100 can be switched between the lighting state and the non-lighting state by pressing the light-emitting surface 20 of the planar light source 10.

The lighting system 100 preferably includes two or more duct rails 40 from the viewpoint of stably mounting and supporting the planar light source 10 on the duct rail 40 and enabling repetitive detachment without damage.

Figure 2:
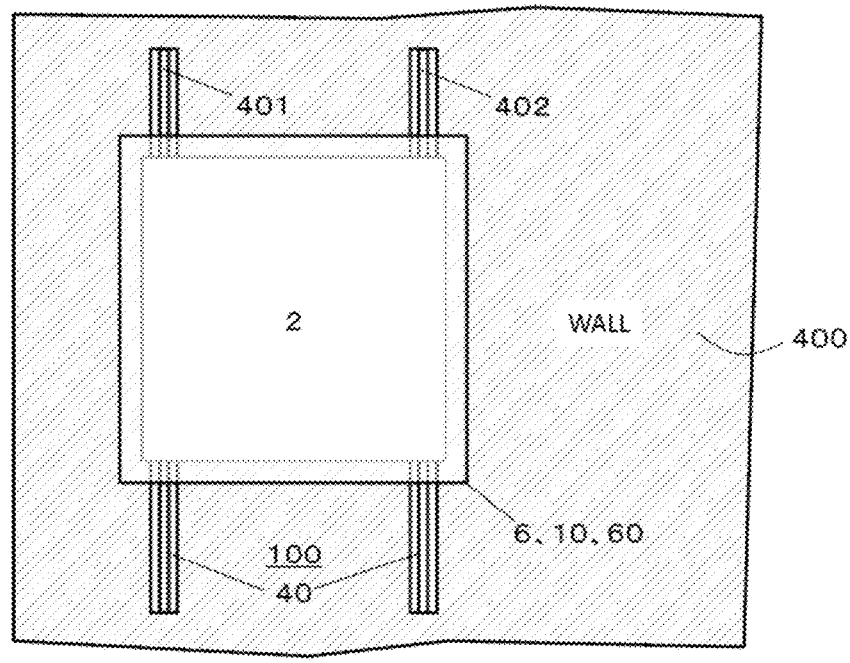
FIG. 2 is a plan view of the lighting system in FIG. 1.

As illustrated in FIGS. 1 and 2, it is preferable for the lighting system 100 that at least two duct rails 40 are attached to the mounting surface 400 and that the adjacent two duct rails 40, which are one duct rail 401 and the other duct rail 402, are parallel to each other.

Figure 11:
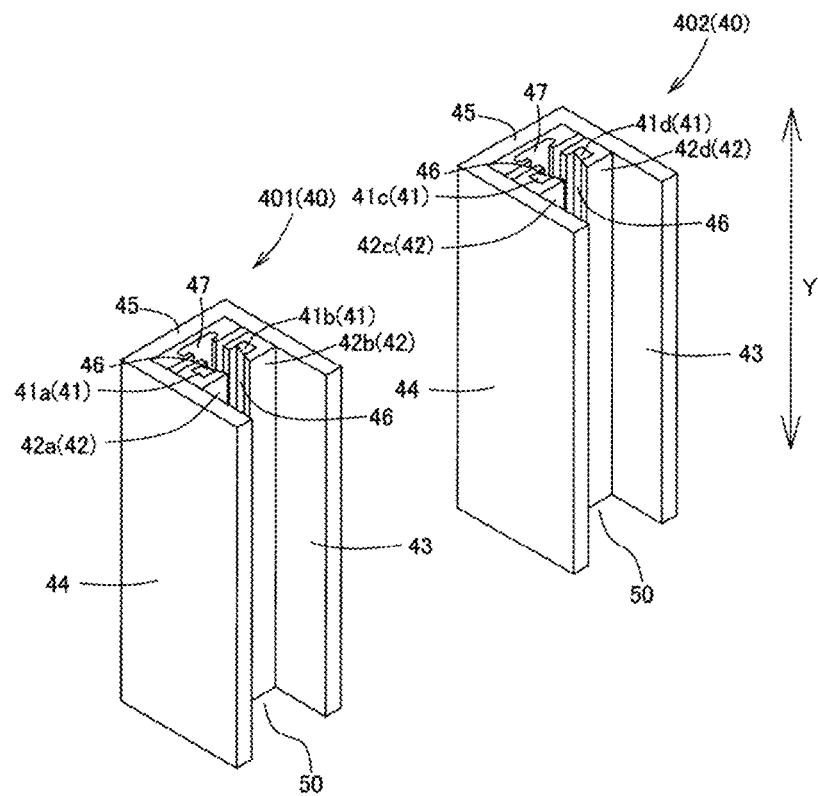
FIG. 11 is a cross-sectional perspective view of duct rails in FIG. 6.

From the viewpoint of surely preventing a short circuit or electric leakage in the duct rail 40, the adjacent two duct rails 40 (401 and 402) preferably include rails 42a and 42b including only linear conductors 41a and 41b that serve as one electrode and rails 42c and 42d including only linear conductors 41c and 41d that serve as the other electrode as illustrated in FIG. 11.

That is, it is preferable that the duct rail 401 includes the rails 42a and 42b including the linear conductors 41a and 41b electrically connected to one of electrodes of an external power source or an external device, and the duct rail 402 includes the rails 42c and 42d including the linear conductors 41c and 41d electrically connected to the other electrode of the external power source or the external device.

As illustrated in FIG. 2, the lighting system 100 of the embodiment has a plurality of duct rails 40 provided in parallel and a plurality of planar light sources 10 disposed widely across a plane, which as a whole provide lighting.

In the following, description is made in a particular for one planar light source 10 and one pair of duct rails 40 for ease of understanding.

(Planar-Light-Emitting Light Source 10)

Figure 3:
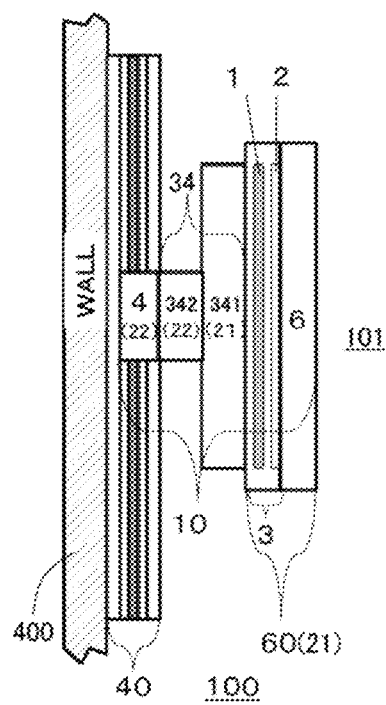
FIG. 3 is a cross-sectional view schematically illustrating the lighting system in FIG. 1.

As illustrated in FIG. 3, the planar-light-emitting light source 10 (planar light source 10) includes the planar-light-emitting panel 60 (planar panel 60), a connecting unit 34, and the engaging part 4 which are disposed closer to the light-emitting surface 20 in this order.

Figure 8:
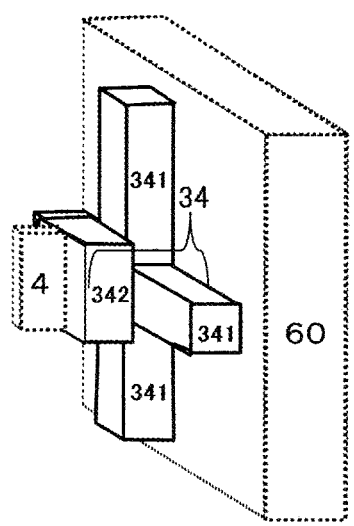
FIG. 8 is a perspective view schematically illustrating the vicinity of the connecting unit in FIG. 7.

As illustrated in FIGS. 3 and 8, the connecting unit 34 connects the planar panel 60 and the engaging part 4, and includes a tile terminal surface protective member 341 (hereinafter also simply referred to as a protective member 341) and the push switch member 342.

Figure 4:
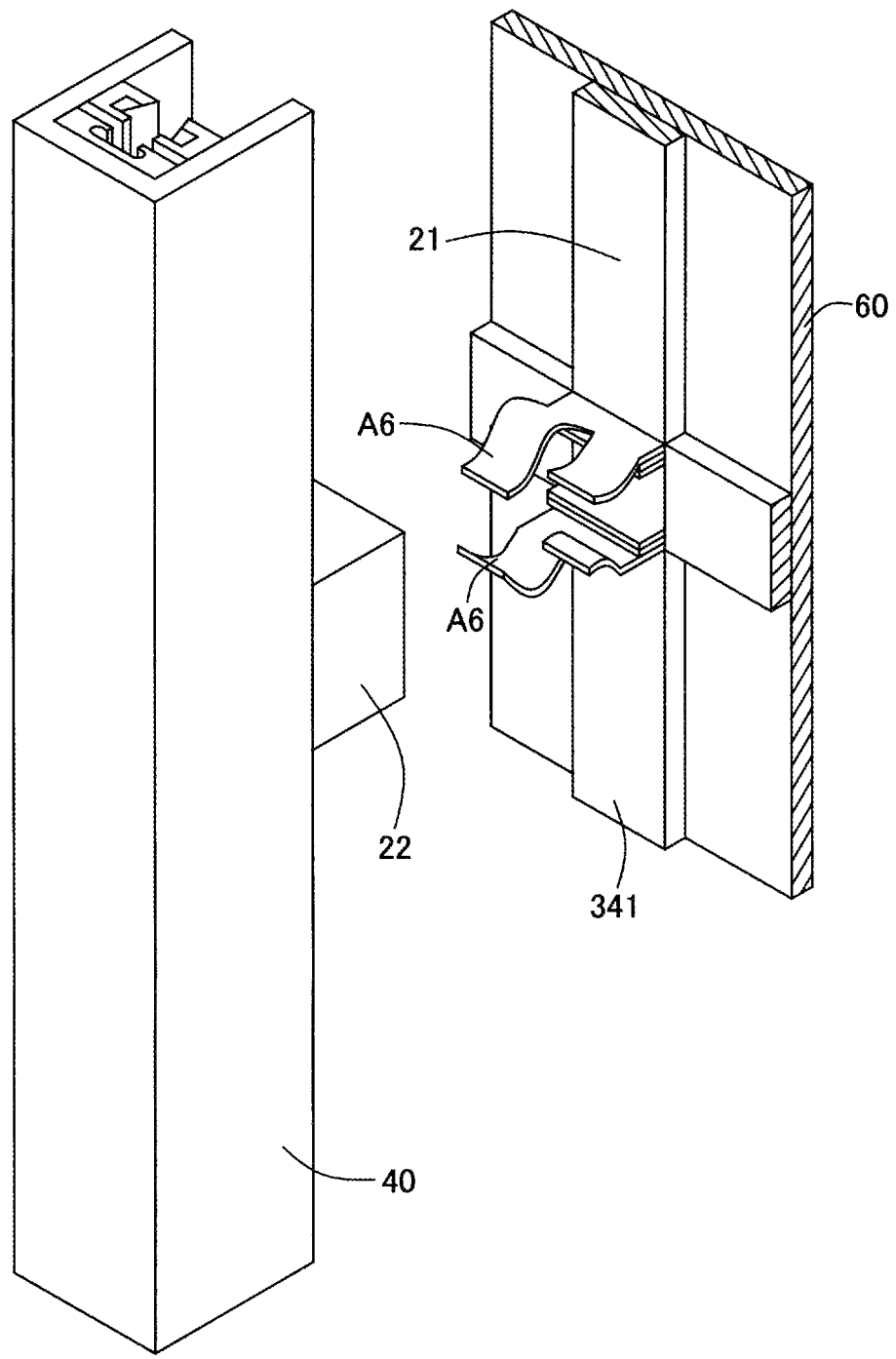
FIG. 4 is an exploded perspective view of the lighting system in FIG. 1 disassembled at a connecting unit.

As illustrated in FIGS. 4 and 8, the connecting unit 34 includes a light source body 21 including the planar panel 60 and the protective member 341, and an engaging member 22 including the push switch member 342 and the engaging part 4, where the light source body 21 and the engaging member 22 are separable. With the light source body 21 and the engaging member 22 being separable, the light source body 21 having a basic structure having a form of a plate as in the embodiment can be stacked in a compact size and packed with little chances of damage.

As in the embodiment, the engaging member 22 having a basic structure having a form of a rod or block with a cross sectional area of about several centimeters can be stored together with other engaging members 22 in a packing box or attached to a packed light source body 21 to be transported and sold. In addition, the engaging member 22 can easily be attached to the duct rail 40.

The planar light source 10 includes not only the planar panel 60, the connecting unit 34, and the engaging part 4 but also a bezel serving as a casing for a planar-light-emitting tile 3, a printed circuit board (PCB), and a wiring member.

Figure 7:
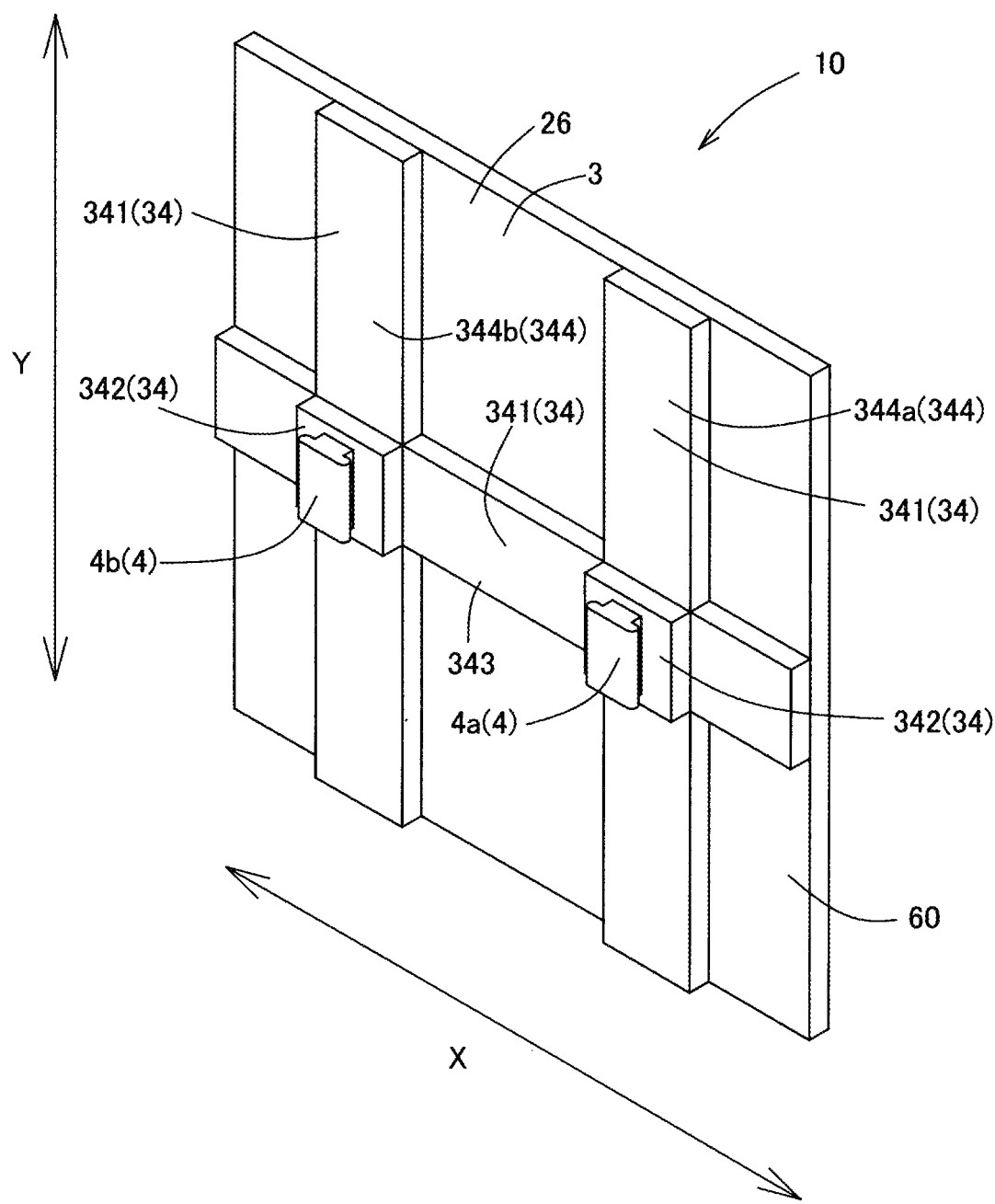
FIG. 7 is a perspective view of a planar light source in FIG. 6 as viewed along an angle different from that in FIG. 6.

As illustrated in FIG. 7, the planar light source 10 preferably includes at least two engaging parts 4 (4a and 4b) (detachable portions).

The planar light source 10 preferably includes the engaging part 4a electrically connected to one of electrodes of the planar panel 60 and the other engaging part 4b electrically connected to the other electrode of the planar panel 60. Furthermore, the planar light source 10 preferably includes the engaging part 4a (first detachable portion) which is electrically connected to the linear conductors 41a and 41b of the duct rail 401 and serves as one of the electrodes, and the other engaging part 4b (second detachable portion) which is electrically connected to the linear conductors 41c and 41d of the duct rail 402 and serves as the other electrode.

That is, it is preferable that the planar light source 10 includes the engaging part 4a constituting a portion of the power supply path and detachable from the duct rail 401 and the engaging part 4b constituting a portion of the power supply path and detachable from the duct rail 402.

Hereinafter, the components of the planar light source 10 according to the first embodiment of the present invention will be described in detail.

As illustrated in FIG. 7, the planar light source 10 includes the planar panel 60, the connecting unit 34, and the engaging part 4 (4a and 4b).

(Planar Panel 60)

Figure 6:
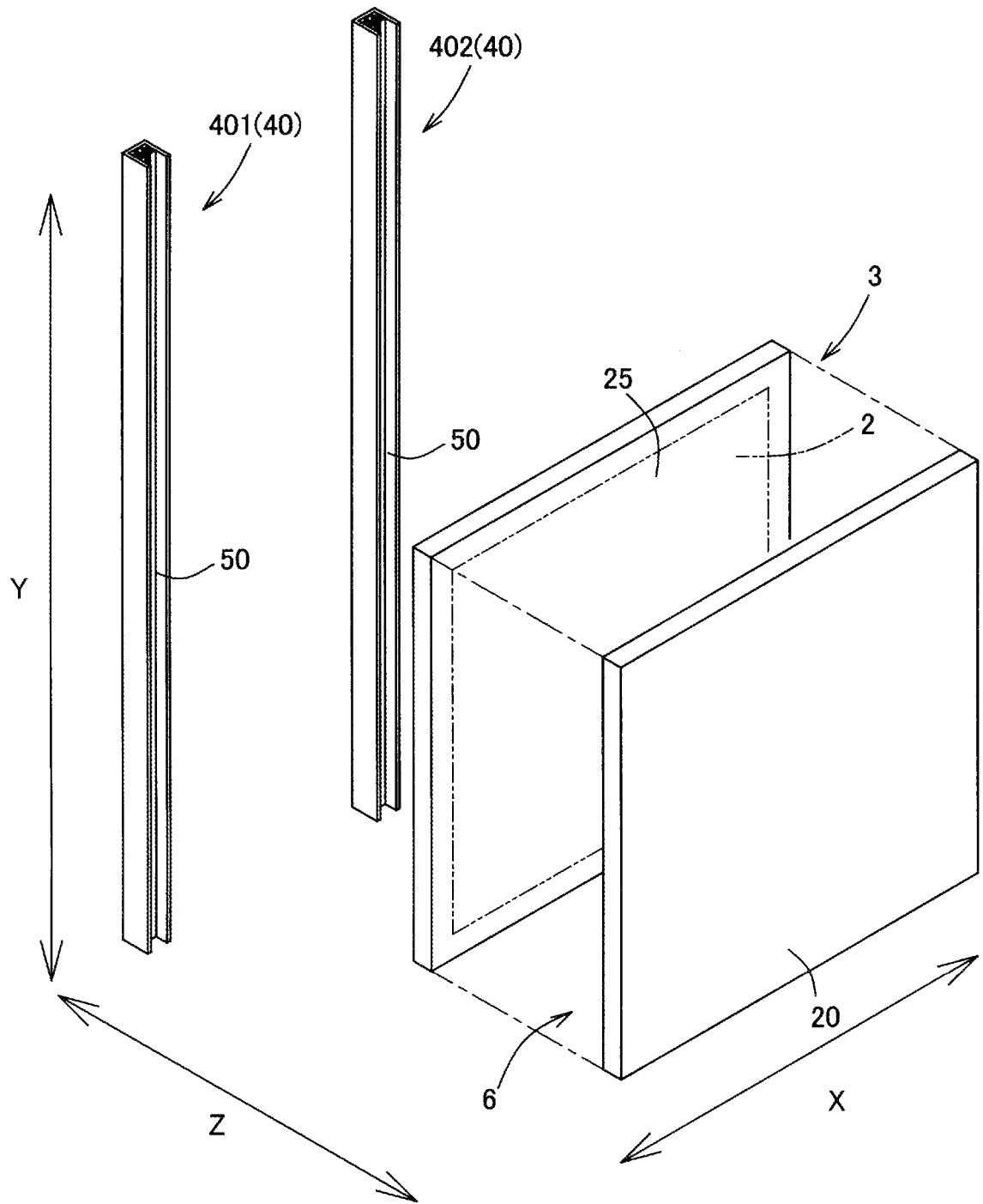
FIG. 6 is an exploded perspective view of the lighting system in FIG. 1.

As illustrated in FIG. 6, the planar panel 60 includes a translucent plate 6 and the planar-light-emitting tile 3 which are disposed closer to the light-emitting surface 20 in this order, and the light-emitting surface 20 also serving as a push switch surface is composed of the translucent plate 6. In this manner, the planar-light-emitting tile 3 including the planar-light-emitting element 1 is protected from an impact caused by a switch operation or the like while allowing transmission of the light from a light-emission plane 25.

From the viewpoint of giving sufficient impact resistance and the viewpoint of providing the planar light source 10 that is lightweight and small in thickness, the organic EL tile having an organic EL element as the planar-light-emitting element 1, which has an advantage in small thickness and lightweight, is preferable to be used as the planar-light-emitting tile 3. That is, it is preferable that the planar panel 60 is an organic EL panel. With such a configuration, illumination light having excellent properties in softness and color rendering can easily be obtained.

The planar panel 60 of the embodiment is an organic EL panel in which an organic EL element is implemented.

(Translucent Plate 6)

The translucent plate 6 is a plate-shaped member constituting the light-emitting surface 20 also serving as a push switch surface.

The translucent plate 6 protects the planar-light-emitting tile 3 from an impact caused by a switch operation or the like while allowing transmission of the light from the light-emission plane 25 of the planar-light-emitting tile 3. That is, the translucent plate 6 is a protective plate for protecting the light-emission plane 25 of the planar-light-emitting tile 3.

A glass, a resin, or the like that allows light transmission can be used as a material of the translucent plate 6. The material of the translucent plate 6 is preferably a transparent thermoplastic resin, which is inexpensive, excellent in formability, and lightweight.

The translucent plate 6 is preferably a plate member made of resin.

As a material of the translucent plate 6, for example, a resin material such as vinyl chloride resin, acrylic resin, polyethylene terephthalate (PET) resin, and polycarbonate resin can be used. From the viewpoint of light transmission and weather resistance, acrylic resin is more preferable.

The average thickness of the translucent plate 6 is preferably from 0.5 mm to 10 mm, inclusive, more preferably, from 1 mm to 5 mm, inclusive.

Within such a range, the planar panel 60 that is small in thickness and lightweight is provided with sufficient protective property against impact.

The translucent plate 6 is preferably provided with an optical functional material at least on the outermost surface, in a plan view from the light-emitting surface 20 which is one of main surfaces, of the region including a light-emitting region 2.

With such a configuration, luminance, color, and angle-dependent optical characteristics of the illumination light from the light-emitting surface 20 and light distribution to an illumination target can be improved The optical functional material includes a lens and a prism. Examples of the optical functional material are a lens sheet, a prism sheet, and a lenticular lens sheet.

The translucent plate 6 having the optical functional material may be prepared by nanoimprinting the acrylic resin or the like applied on the surface of the body plate of the translucent plate 6 or by spray-coating or slit-coating the resin containing glass beads on the translucent plate 6.

Preferably, the translucent plate 6 having the optical functional material may be prepared by bonding a resin film (optical film) having an irregular structure on the first surface and an adhesive on the second surface to the body plate so that the first surface is on the outermost of the translucent plate 6. Light scattering properties can be provided to such an optical film.

While the surface of the film is easily scratched in the process of attaching the optical film, the optical film may be attached after or before assembly of the planar panel 60 or after the planar panel 60 is attached to the planar light source 10, depending on the situation.

Such an optical functional material provides light scattering surface to the appearance of the light-emitting surface 20. That is, the optical functional material gives, for example, white external appearance to the light-emitting surface 20.

By using the translucent plate 6 having the optical functional material exhibiting such a white external appearance, the planar light source 10 may be given further excellent appearance.

Figure 5:
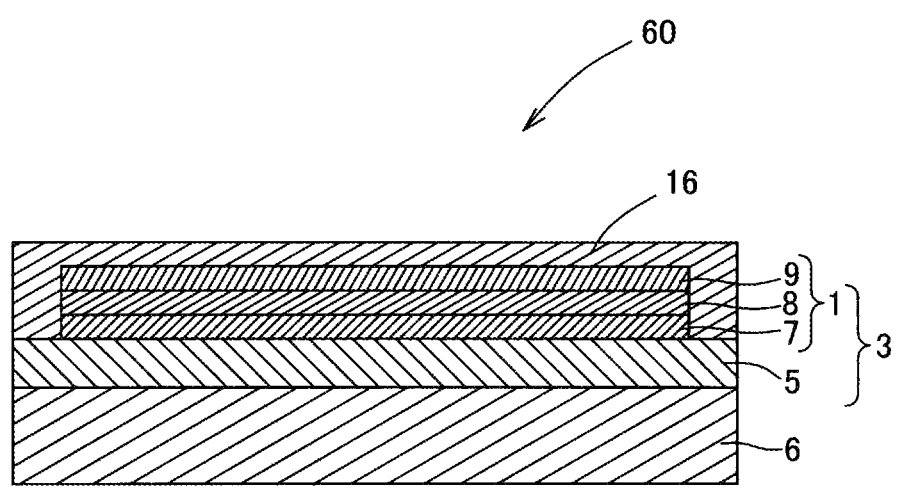
FIG. 5 is a cross-sectional view schematically illustrating a planar-light-emitting panel in FIG. 1.

In a case where no optical functional material is provided, namely, for a case of a simple transparent plate is used as the translucent plate 6, when the planar-light-emitting tile 3 is an organic EL tile as in FIG. 5 and the organic EL element included in the organic EL tile is not lighted (in the non-lighting state), the appearance of the light-emitting surface 20 exhibits a metallic luster which is of the surface, in the side of an organic functional film layer 8, of a reflective conductive film layer 9 observed via the transparent region.

That is, the light-emitting surface 20 has appearance of a mirror surface reflecting the color of the reflective conductive film layer 9 which is the electrode of the embedded organic EL element.

Therefore, using the organic EL panel having appearance of a mirror surface when the organic EL element is not lighted (in the non-lighting state) as the planar panel 60, the planar light source 10 can be used as a mirror when the organic EL element is not lighted. That is, the planar light source 10 can be used as a light source having appearance of a mirror and excellent functional and design properties.

(Planar-Light-Emitting Tile 3)

The planar-light-emitting tile 3 has the light-emission plane 25 (see FIG. 6) including the light-emitting region 2 facing the light-emitting surface 20, a terminal surface 26 (see FIG. 7) facing the opposite side, and the planar-light-emitting element 1 corresponding to the light-emitting region 2, the light-emission plane 25 and the terminal surface 26 being main surfaces, the planar-light-emitting element 1 being disposed between the main surfaces 25 and 26.

The planar-light-emitting tile 3 of the embodiment has as one of the main surfaces the light-emission plane 25 including the light-emitting region 2 and as the other main surface the terminal surface 26 provided with an electrode terminal electrically connectable to a contact metal piece A6 (see FIG. 9) of the connecting unit 34. The planar-light-emitting element 1 corresponding to the light-emitting region 2 is disposed between the light-emission plane 25 and the terminal surface 26.

The planar-light-emitting tile 3 is preferably lightweight and small in thickness from the viewpoint of supporting the planar light source 10 in a sufficiently stable manner by the duct rail 40. Specifically, the average thickness of the planar-light-emitting tile 3 is preferably from 0.02 mm to 5 mm, inclusive, more preferably, from 0.2 mm to 2 mm, inclusive.

The planar-light-emitting element 1 embedded in the planar-light-emitting tile 3 is preferably an organic EL element from the viewpoint of lightweight and small in thickness and from the viewpoint of obtaining high quality light emission.

The terminal surface 26 includes at least two types of electrode terminals.

For example, the terminal surface 26 includes at least two types of electrode terminals, which are an anode electrode terminal electrically connected to the anode side of the planar-light-emitting element 1 and a cathode electrode terminal electrically connected to the cathode side of the planar-light-emitting element 1.

The organic EL tile provided as the planar-light-emitting tile 3 will be described in detail as follows.

For the organic EL tile used as the planar-light-emitting tile 3, from the viewpoint of increasing the area efficiency, for example, the planar-light-emitting element 1 included in the organic EL tile is preferably an organic EL element that has, as an equipotential electrode layer to which power is directly supplied from the outside of the planar-light-emitting tile 3, only a pair of a translucent conductive film layer 7 which is a translucent anode layer, and the reflective conductive film layer 9 which is a reflective cathode layer, where the translucent conductive film layer 7 and the reflective conductive film layer 9 oppose to each other, as illustrated in FIG. 5. From the viewpoint of transparency and sealability, it is preferable that, for example, the supporting substrate of the organic EL element is a glass substrate 5 which is, in this case, disposed further in the side of the light-emitting surface 20 than the position of the planar-light-emitting element 1 is disposed.

As illustrated in FIG. 5, the organic EL element is a device formed on the glass substrate 5 as a layered portion composed of the translucent conductive film layer 7, the organic functional film layer 8, and the reflective conductive film layer 9 each of which formed in a predetermined shape. Note that the organic functional film layer 8 includes an organic light-emitting layer containing organic compounds, which is composed of a plurality of thin film layers.

(Sealing)

The organic EL element provided as the planar-light-emitting element 1 is preferably sealed with a sealing film 16 to prevent intrusion of outside moisture.

When film sealing is used, it is preferable to attach a protective film made of PET or the like with an adhesive to prevent scratches caused by an external mechanical force. In this manner, a dark spot (DS) and sudden termination of light emission can be prevented.

The organic EL tile provided as the planar-light-emitting tile 3 includes an organic EL element formed of the translucent conductive film layer 7, the organic functional film layer 8, and the reflective conductive film layer 9 layered on the glass substrate 5, where the translucent conductive film layer 7, the organic functional film layer 8, and the reflective conductive film layer 9 overlap in a plan view of the glass substrate 5. In the planar-light-emitting tile 3, the organic EL element is sealed with the glass substrate 5 and the sealing film 16.

(Connecting Unit 34)

The connecting unit 34 is disposed between the planar panel 60 and the engaging part 4 and includes a power supply path for supplying power from the duct rail 40 to the planar-light-emitting element 1.

As illustrated in FIG. 3, the connecting unit 34 includes a tile terminal surface protective member 341 (protective member 341) and the push switch member 342 disposed closer to the terminal surface 26 (light-emitting surface 20) in this order.

The push switch member 342 includes a pair of push switch mechanisms.

The push switch member 342 is operated by pressing (pushing) the push switch surface to set and keep the switch circuit to an ON (closed) state and to set and keep the switch circuit to an OFF (open) state. That is, by pushing the push switch surface of the push switch member 342, a pair of push switch mechanisms are electrically connected, and by pushing the push switch surface again, a pair of push switch mechanisms are electrically disconnected.

A pair of switch mechanisms are provided in parallel to oppose to each other in a direction perpendicular to the light-emitting surface 20 (front-rear direction Z).

(Protective Member 341)

As illustrated in FIG. 7, the protective member 341 protects the terminal surface 26 of the planar-light-emitting tile 3.

The protective member 341 receives a force, applied to the translucent plate 6 given by a user, uniformly across the entire surface of the planar panel 60, thereby preventing damage to the planar-light-emitting tile 3, preventing inclination of the planar panel 60 to the duct rail 40, and efficiently concentrating the pushing force on the push switch member 342.

From the viewpoint of efficiently performing such functions, the protective member 341 preferably includes, as a whole, two shaft portions 343 and 344 having the lengths same as respective two perpendicular sides of the planar panel 60.

From the viewpoint of providing a protective member that does not appear on the exterior, the protective member 341 preferably includes the two shaft portions 343 and 344 having lengths smaller than the lengths of the respective two perpendicular sides.

It is further preferable that the protective member 341 includes the two shaft portions 343 and 344 having lengths equal to or more than two thirds of the lengths of the respective two perpendicular sides.

As in the embodiment, the protective member 341 is preferably, in particular, formed of combined two or more shaft portions 343 and 344 having a bar shape and parallel to the respective two perpendicular sides of the planar panel 60 and having lengths smaller than the respective sides but larger than two thirds of the respective sides. That is, the protective member 341 includes the two shaft portions 343 and 344 which are parallel to the respective adjacent two sides of the planar panel 60.

The shaft portion 343 intersects at the center in the longitudinal direction of the shaft portion 344.

The protective member 341 of the embodiment includes three shaft portions 343, 344*a*, and 344*b*, where the shaft portion 343 intersects the shaft portions 344*a* and 344*b*.

The material of the protective member 341 is not limited. As a material of the protective member 341, for example, a metal material such as SUS and aluminum or a resin material or the like can be used. Preferably, a transparent thermoplastic resin, which is lightweight, inexpensive, and excellent in formability, is used.

The thickness of the protective member 341 (when a movable contact plate A5 exists, the thickness not including the thickness of the movable contact plate A5) or the thickness of the protective member 341 having a bar shape is preferably from 1 mm to 20 mm, inclusive, more preferably, from 2 mm to 10 mm, inclusive.

Within such ranges, the planar panel 60 that is small in thickness and lightweight has sufficient properties for protection against impact and inhibition against inclination.

Figure 13A:
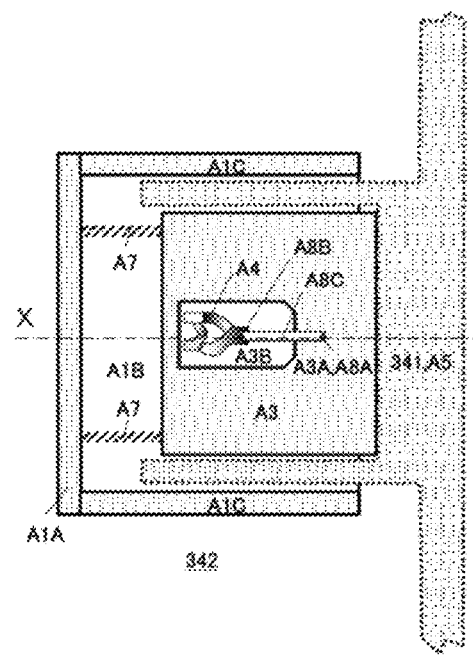
Figure 13B:
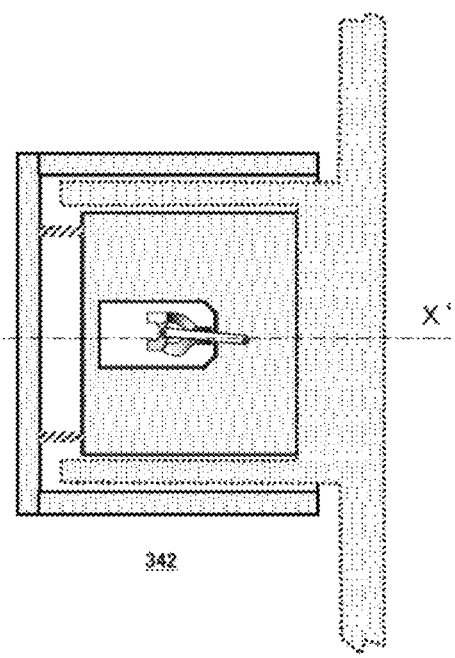

The protective member 341 as described above preferably includes a portion of the movable contact plate A5 that is illustrated in FIGS. 13A and 13B and that can be fitted in the push switch member 342. Here, the thickness of movable contact plate A5 is not included in the thickness of the protective member 341. Such a configuration reduces the number of members.

That is, the movable contact plate A5 preferably constitutes a portion of the protective member 341. In this case, the thickness of the movable contact plate A5 is not included in the thickness of the protective member 341.

The movable contact plate A5 further preferably includes two plate portions which are perpendicular to the light-emitting surface 20 and oppose to each other. From the viewpoint of stably supporting the planar light source 10, the movable contact plate A5 is further preferably provided as a plate portion extending in a vertical direction (up-down direction Y).

(Push Switch Member 342)

The push switch member 342 has a push switch mechanism and connects the protective member 341 to the engaging part 4. The push switch member 342 includes a portion of a power supply path for supplying power from the duct rail 40 to the planar-light-emitting element 1.

The push switch mechanism is preferably a mechanism that performs an alternate-action.

Examples methods of the alternate-action include a method using a heart cam, a rotating cam, or a ratchet cam.

As illustrated in FIGS. 13A-13B and 14A-14B, the push switch member 342 of the embodiment is a push switch mechanism that performs an alternate-action, and includes a heart cam push switch mechanism.

Figure 14A:
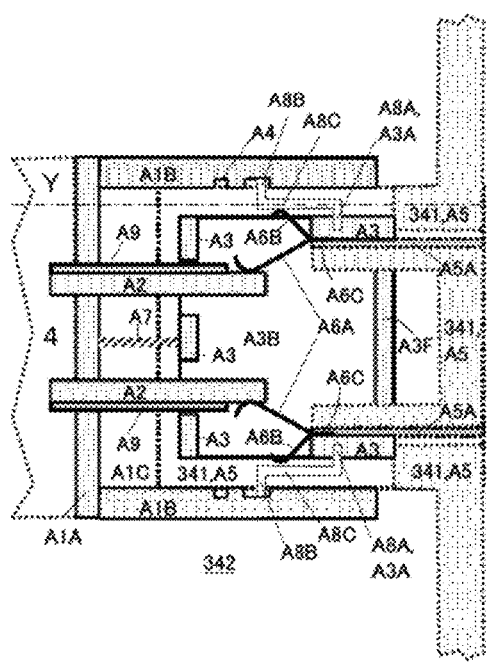
Figure 14B:
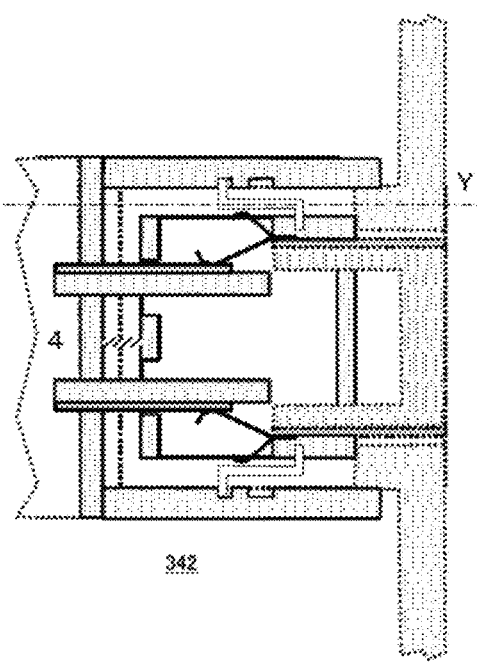

As illustrated in FIGS. 14A and 14B, the push switch member 342 has, in particular, heart cam grooves A4 and A4 respectively provided in two opposing top and bottom plates A1B and A1B which are perpendicular to the light-emitting surface 20 provided as a push switch surface having a large area, unlike a normal switch, to provide stable push switch operations.

Figure 9:
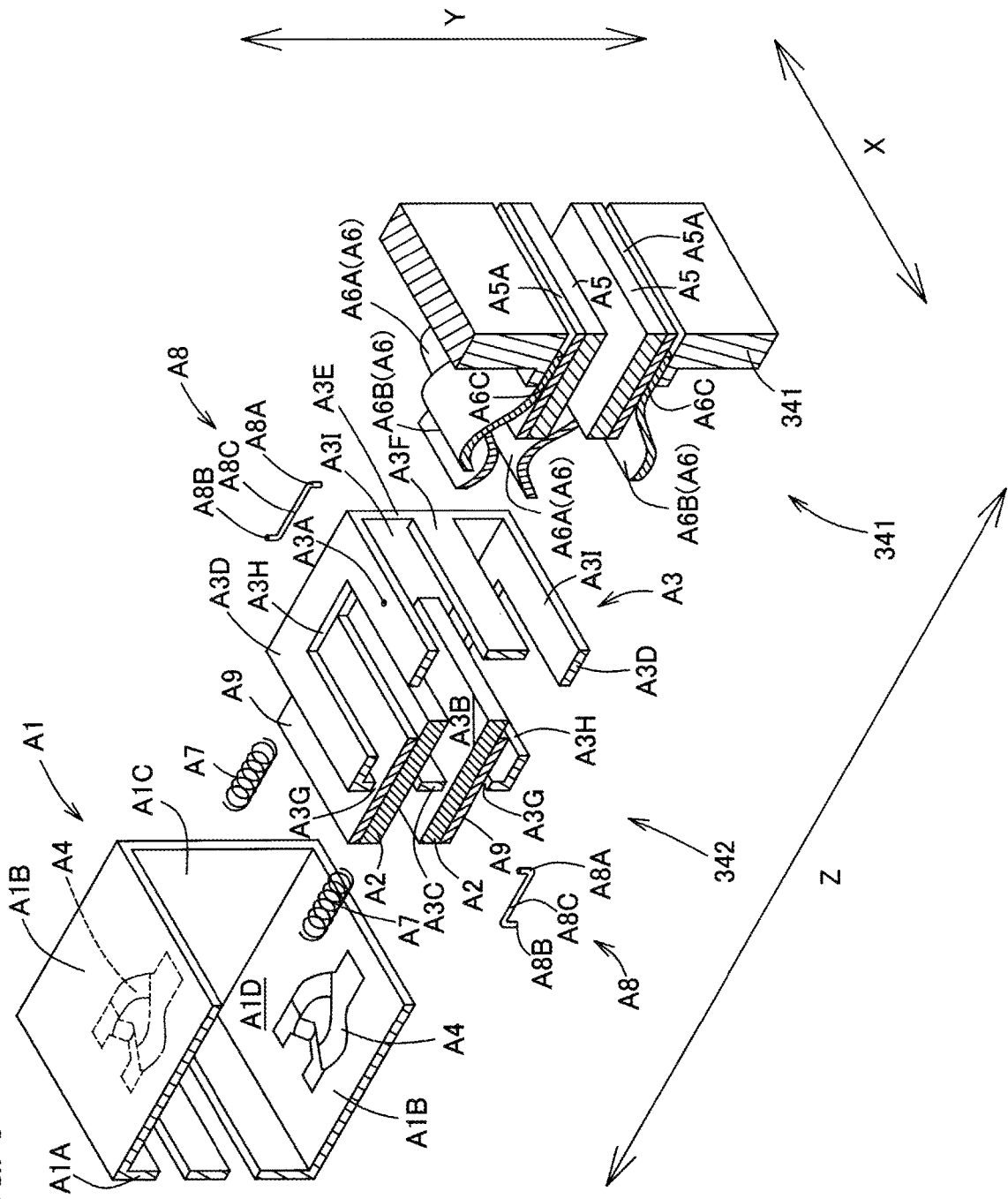
FIG. 9 is an exploded perspective view focusing on the vicinity of a push switch member in FIG. 1.

As illustrated in FIG. 9, the push switch member 342 includes, as main components, a connecting unit body A1, a pair of fixed contact terminal plates A2 and A2, a plunger A3, the protective member 341, the contact metal piece A6, push switch springs A7 and A7, and pins A8 and A8.

The connecting unit body A1 constitutes a portion of the push switch mechanism.

As can be understood from FIGS. 9, 13, and 14, the connecting unit body A1 includes an engaging part mounting plate A1A, top and bottom plates A1B and A1B, and left and right plates A1C and A1C. The plates A1A, A1B, A1B, A1C, and A1C form an enclosed space A1D.

The engaging part mounting plate A1A constitutes a mounting face on which the engaging part 4 is mounted.

The top and bottom plates A1B and A1B oppose to each other along the up-down direction Y with the enclosed space A1D between the top and bottom plates A1B and A1B. The heart cam grooves A4 and A4 are formed in the middle in the front-rear direction Z of the top and bottom plates A1B and A1B.

The left and right plates A1C and A1C oppose to each other along a left-right direction X with the enclosed space A1D between the left and right plates A1C and A1C.

The heart cam groove A4 is a groove having a heart shape in a plan view with locally different depths.

As illustrated in FIGS. 14A and 14B, the heart cam grooves A4 are provided in the inner surfaces of the opposing top and bottom plates A1B. The heart cam groove A4 runs along a heart-shape and has a step facing a predetermined direction.

Figure 10A:
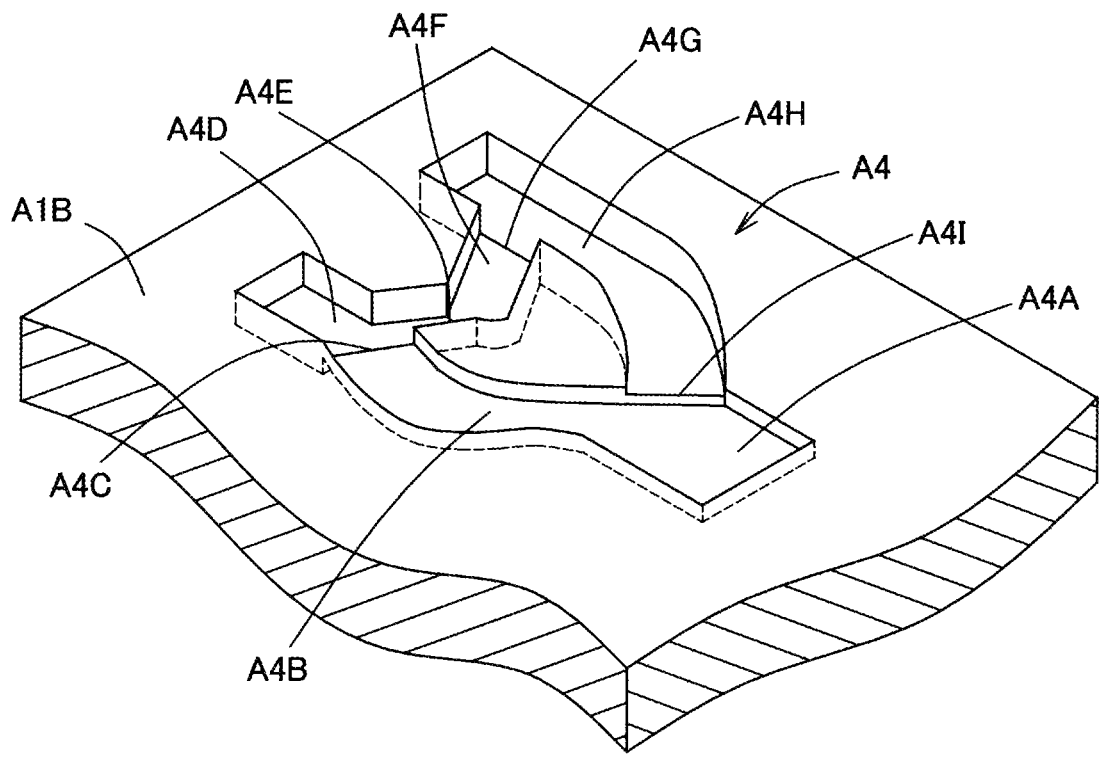
Figure 10B:
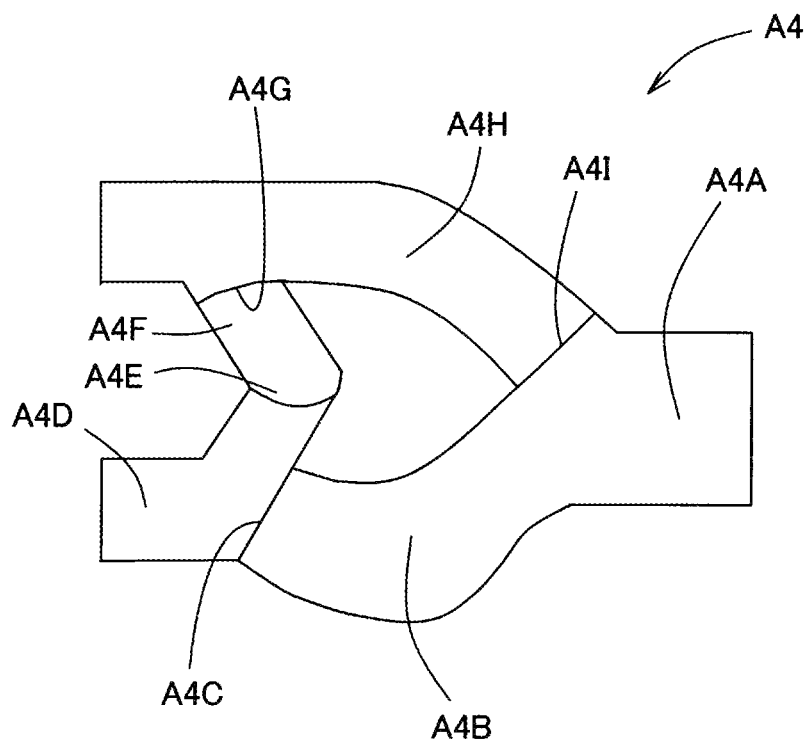

Specifically, as illustrated in FIGS. 10A and 10B, the heart cam groove A4 is an annularly continuous and closed bottomed groove. The heart cam groove A4 has a descending sloped portion A4B, a stepped portion A4C, a flat portion A4D, a stepped portion A4E, an ascending sloped portion A4F, a stepped portion A4G, an ascending sloped portion A4H, and a stepped portion A4I in this order from a proximal portion A4A along the circumference, where the proximal portion A4A is located in the rearmost.

The descending sloped portion A4B gradually slopes downward toward the stepped portion A4C. The distal end of the descending sloped portion A4B is shallower than the proximal end of the flat portion A4D by the height of the stepped portion A4C.

The flat portion A4D is deeper than the proximal end of the ascending sloped portion A4F by the height of the stepped portion A4E.

The ascending sloped portion A4F gradually slopes upward toward the stepped portion A4G. The distal end of the ascending sloped portion A4F is shallower than the proximal end of the ascending sloped portion A4H by the height of the stepped portion A4G.

The ascending sloped portion A4H gradually slopes upward toward the stepped portion A4I. The distal end of the ascending sloped portion A4H is shallower than the proximal end of the proximal portion A4A by the height of the stepped portion A4I.

As illustrated in FIG. 9, the fixed contact terminal plates A2 and A2 oppose to each other in the up-down direction Y with a space therebetween. Fixed contact terminals A9 and A9 are provided on the outer surfaces of the fixed contact terminal plates A2 and A2.

The fixed contact terminals A9 and A9 are electrically connected to the engaging part 4 and are connected to the contact metal pieces A6 and A6. The fixed contact terminals A9 and A9 are plate-shaped or foil-shaped conductors and are formed on the outer surfaces, in the up-down direction Y, of the fixed contact terminal plates A2 and A2.

The plunger A3 constitutes a portion of the push switch mechanism.

As illustrated in FIG. 9, the plunger A3 has a box-shaped body having inside a plunger space A3B. The plunger A3 has wall portions A3C, A3D, A3D, A3E, A3E, and A3F forming six surfaces.

Fixed contact insertion slots A3G and A3G are formed in the wall portion A3C located in the side to the engaging part 4. The fixed contact terminal plates A2 and A2 and the fixed contact terminals A9 and A9 can be inserted in the fixed contact insertion slots A3G and A3G.

The insertion slots A3G and A3G are each a through hole having a form of a slit extending in the left-right direction X.

Openings A3H and A3H are provided in the wall portions A3D and A3D opposing to each other in the up-down direction Y with the plunger space A3B therebetween. A portion of the contact metal piece A6 and a portion of the pin A8 can pass through the openings A3H and A3H.

Movable plate insertion slots A3I and A3I are provided in the wall portion A3F opposing to the wall portion A3C with the plunger space A3B therebetween. The movable contact plates A5 and A5 of the protective member 341 can be inserted in the movable plate insertion slots A3I and A3I. That is, the plunger space A3B is in communication with the outside through the openings A3H and A3H and the insertion slots A3G, A3G, A3I, and A3I.

As illustrated in FIG. 9, the protective member 341 has a pair of movable contact plates A5 and A5 at the distal ends (front side ends) thereof.

The movable contact plates A5 and A5 are to be fitted in the push switch member 342.

The movable contact plates A5 and A5 are plate members perpendicular to the light-emitting surface 20 and extending in the left-right direction X.

The movable contact plates A5 and A5 oppose to each other in the up-down direction Y with a space therebetween. Movable contact terminals A5A and A5A are formed on the respective outer surfaces of the movable contact plates A5 and A5.

The movable contact terminals A5A and A5A are electrically connected to electrode terminals (not illustrated) formed on the terminal surface 26 of the planar panel 60. The movable contact terminals A5A and A5A are connected to the contact metal pieces A6 and A6 when lighting is on.

The movable contact terminals A5A and A5A are plate-shaped or foil-shaped conductors and are formed on the outer surfaces, in the up-down direction Z, of the movable contact plates A5 and A5.

The contact metal piece A6 is a conductive member for electrically connecting the fixed contact terminal A9 and the movable contact terminal A5A. The contact metal piece A6 includes a movable contact spring section A6A and a leaf spring section A6B as described later.

The push switch springs A7 and A7 are urging members that are attached to the engaging part mounting plate A1A to urge the plunger A3 toward the rear side (the side to the light-emitting surface). The push switch springs A7 and A7 are elastic members having elasticity.

The pin A8 is a position guiding member for guiding the relative position of the plunger A3 to the connecting unit body A1. As illustrated in FIG. 9, the pin A8 has a leaf spring contact portion A8C extending in the front-rear direction Z, a heart cam groove contact tip A8B provided on an end (front end) of the leaf spring contact portion A8C to extend outward in the up-down direction Y, and a hole-insertion portion A8A provided on the other end (rear end) of the leaf spring contact portion A8C to extend inward in the up-down direction Z.

The operation of the heart cam push switch mechanism of the push switch member 342 will be described with reference to FIGS. 13A-13B and 14A-14B.

In FIGS. 13A and 13B, the heart cam groove A4, provided in the top and bottom plates A1B, located above YY' cross section in FIGS. 14A and 14B, and the plunger space A3B of the plunger A3 located below Y-Y' cross section in FIGS. 14A and 14B are illustrated.

The hole-insertion portion A8A which is one end of the pin A8 is inserted in a plunger pin supporting hole A3A in an immovable manner, and the heart cam groove contact tip A8B which is the other end of the pin A8 moves along with sliding of the plunger A3 (in the left-and-right movement in FIGS. 13A, 13B, 14A, and 14B) while making contact with the heart cam groove A4.

When the plunger A3 moves to a certain position (FIGS. 13B and 14B) and stops, the heart cam groove contact tip A8B stops at the step in the heart cam groove A4 and cannot return to the original position. When the plunger A3 moves again, the heart cam groove contact tip A8B moves slightly backward, and then returns along the groove to the initial position at the step where the heart cam groove contact tip A8B can move freely (FIGS. 13A and 14A). When the push switch is pushed twice, the heart cam groove contact tip A8B goes round a full circle along the heart cam groove A4 having a heart shape, thereby turning the switch ON and OFF.

The behavior of the heart cam groove contact tip A8B of the pin A8 in the heart cam groove A4 in the operation of the heart cam push switch mechanism will be described in more detail later.

In the heart cam push switch mechanism of the push switch member 342 illustrated in FIGS. 14A and 14B, a contact metal piece A6 including the movable contact spring section A6A, the leaf spring section A6B, and a contact metal piece middle section A6C is used.

The contact metal piece A6 of the embodiment is formed by bending a single metal piece into the movable contact spring section A6A, the leaf spring section A6B, and the contact metal piece middle section A6C.

That is, the movable contact spring section A6A is a portion bent at the distal end of the contact metal piece middle section A6C to one side in a thickness direction, and the leaf spring section A6B is a portion bent at the distal end of the contact metal piece middle section A6C to the other side in the thickness direction.

The movable contact spring section A6A can be electrically connected to the fixed contact terminal A9 via metal slide contact by the ON/OFF operations.

The leaf spring section A6B pushes, with an elastic force, the heart cam groove contact tip A8B of the pin A8 fixed at the plunger pin supporting hole A3A onto the heart cam groove A4.

Since the contact metal piece A6 is an integrally formed part as described above, an additional spring used for creating contact and push with an elastic force is not necessary. Thus, the number of parts to be used is reduced, and no other part is provided fully inside the plunger space A3B other than the contact metal piece A6. Therefore, the push switch member 342 can be assembled easily, and thus a push switch member 342 can be provided with low cost.

Furthermore, as illustrated in FIGS. 14A and 14B, the contact metal piece A6 preferably includes the contact metal piece middle section A6C that fixes the contact metal piece A6 to the plunger A3 and includes a contact metal piece middle section movable contact surface that is electrically connected, via slide contact, to the movable contact terminal A5A provided on the movable contact plate A5. That is, it is preferable that the contact metal piece A6 is always electrically connected to the movable contact terminal A5A by the contact metal piece middle section A6C sliding on the movable contact terminal A5A of the movable contact plate A5.

Consequently, no additional power supply member is needed, and thus the number of parts to be used is reduced, the connecting unit 34 can be assembled easily, and the connecting unit 34 can be provided with low cost.

(Duct Rail 40)

Figure 12:
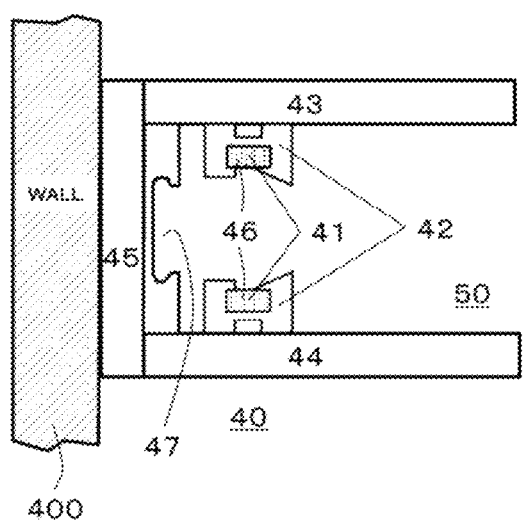
FIG. 12 is a cross-sectional view schematically illustrating the duct rails in FIG. 6.

As illustrated in FIG. 12, the duct rail 40 is preferably detachable from the engaging part 4, and is fixed to the mounting surface 400 which is a vertical surface.

The duct rail 40 includes at least a pair of first engaging part holding plate 43 and a second engaging part holding plate 44 that oppose to each other.

As illustrated in FIG. 6, the duct rail 40 is a thin long member extending in the up-down direction Y, and has a gap 50 between the first engaging part holding plate 43 and second engaging part holding plate 44, in which at least a portion of the engaging part 4 can be held between the holding plates 43 and 44.

As illustrated in FIG. 11, the duct rail 40 is such that one or more rails 42 and one or more linear conductors 41 (conductive members) are fixed to the inner side (the side facing the gap 50) of the first engaging part holding plate 43 and/or the inner side (the side facing the gap 50) of the second engaging part holding plate 44. Furthermore, the duct rail 40 preferably includes a side plate 45 connecting between the ends of the first engaging part holding plate 43 and second engaging part holding plate 44.

The duct rail 40 of the embodiment is a mounting member attachable to the mounting surface 400, and is a rail from which the engaging part 4 can be detached.

The duct rail 40 has a long body with a U-shaped cross section. The duct rail 40 includes the two rails 42 and 42, the linear conductors 41 and 41 respectively corresponding to the rails 42 and 42, the first engaging part holding plate 43 and second engaging part holding plate 44 opposing with a predetermined space therebetween, the side plate 45 connecting the first engaging part holding plate 43 and second engaging part holding plate 44, and a duct rail engaging part 47. That is, three sides of the cross section perpendicular to the longitudinal direction of the duct rail 40 are covered by the first engaging part holding plate 43 and second engaging part holding plate 44 and the side plate 45 and the remaining one side is opened.

The rail 42 has a recessed section 46 that continues along the longitudinal direction (up-down direction Y) of the duct rail 40 and is opened to the gap 50 of the duct rail 40. The linear conductor 41 (conductive member) is fixed within the recessed section 46.

In the duct rail 40, as illustrated in FIG. 12, one rail 42 to which one linear conductor 41 is fixed is fixed to each of the first engaging part holding plate 43 and second engaging part holding plate 44 in a manner that the recessed sections 46 oppose to each other.

The linear conductors 41 and 41 (41a to 41d) are wiring members that can be electrically connected to an external power source, an external device, or another duct rail 40.

The duct rail engaging part 47 is a portion that can engage with an engaging body 17 of the engaging part 4, specifically, is a groove in which the engaging body 17 can be inserted.

The lighting system 100 can include one or more duct rails 40, as described above.

In a case where only one duct rail 40 is included, the engaging part 4 includes a pair of electrode terminals 11 and 12 which are a positive electrode and a negative electrode, that is, two types of electrode terminals 11 and 12 for supplying power from the duct rail 40 to the planar-light-emitting element 1.

Furthermore, the duct rail 40 is also required to include two of the set of the linear conductor 41 and the rail 42, namely, a set of the linear conductor 41a and the rail 42a corresponding to the electrode terminal 11 which is a first electrode terminal and a set of the linear conductor 41b and the rail 42b corresponding to the electrode terminal 12 which is a second electrode terminal.

From the viewpoint of surely supplying power to the engaging part 4 without causing a short circuit or electric leakage in the duct rail 40, it is preferable that the duct rail 40 includes only one type of, either positive or negative, electrode terminal.

(Engaging Part 4)

The planar light source 10 includes at least one engaging part 4 which engages with the duct rail 40 when the planar light source 10 is mounted.

The planar light source 10 preferably includes two engaging parts 4 which engage with the duct rail 40 when the planar light source 10 is mounted, more preferably, the planar light source 10 includes two or more engaging parts 4.

The planar light source 10 includes a portion of a power supply path for supplying power by electrically connecting the engaging part 4 to the connecting unit 34.

Figure 15A:
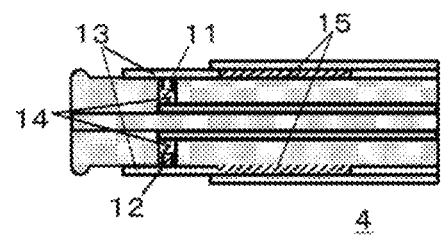
FIG. 15A is a cross-sectional view of an engaging part in FIG. 3 in a non-engaged state.
Figure 15B:
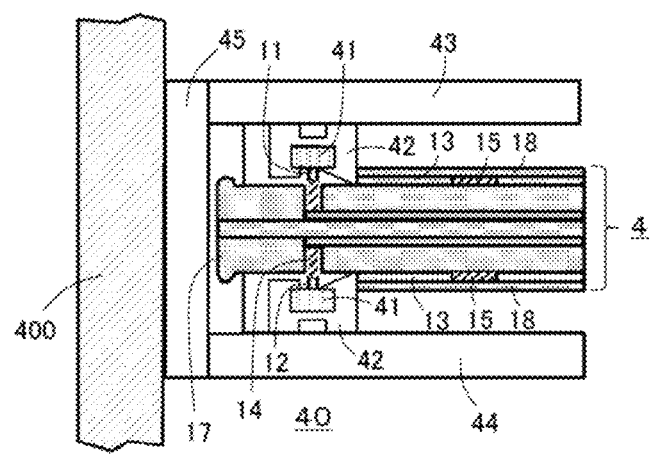
FIG. 15B is a cross-sectional view of the engaging part in FIG. 3 engaged with the duct rail illustrated in FIG. 12.

As illustrated in FIGS. 15A and 15B, one or more engaging parts 4 includes as a whole the electrode terminals 11 and 12 serving as two types of electrode terminals capable of supplying power to the planar-light-emitting element 1. The electrode terminals 11 and 12 are for supplying power from one or more duct rails 40.

That is, when the planar light source 10 has only one engaging part 4, for example, one electrode terminal 11 serves as an anode terminal electrically connected to the anode of the planar-light-emitting element 1 and the electrode terminal 12 serves as a cathode terminal electrically connected to the cathode of the planar-light-emitting element 1.

For a case where a plurality of engaging parts 4a and 4b are provided as in the embodiment, the electrode terminals 11 and 12 of one engaging part 4a serve as anode terminals that are electrically connected to the anode of the planar-light-emitting element 1, and the electrode terminals 11 and 12 of the engaging part 4b serve as cathode terminals that are electrically connected to the cathode of the planar-light-emitting element 1.

As illustrated in FIGS. 15A and 15B, the engaging part 4 is configured to mechanically protect the electrode terminals 11 and 12, namely, the electrode terminals 11 and 12 are shielded and protected by slide plates 13 and 13 so as not to be exposed when the engaging part 4 is not engaged. It is preferable that, when engaged, the engaging part 4 projects, pushed by electrode terminal springs 14 and 14, to be electrically connected to the linear conductors 41 and 41 of the duct rail 40.

As illustrated in FIGS. 15A and 15B, the engaging part 4 includes as main components, the electrode terminals 11 and 12, the slide plates 13 and 13, the electrode terminal springs 14 and 14, slide plate springs 15 and 15, the engaging body 17, and an outer shell member 18.

The electrode terminals 11 and 12 are electrically connected to the fixed contact terminals A9 and A9 (see FIG. 9).

The slide plates 13 and 13 are slidably movable in the front-rear direction Z and cover the electrode terminals 11 and 12 when the engaging part 4 is not engaged.

The electrode terminal springs 14 and 14 are urging members that urge the electrode terminals 11 and 12 in a direction intersecting a sliding direction (front-rear direction Z) of the slide plate 13.

The slide plate springs 15 and 15 are urging members that urge the slide plates 13 and 13 to the front side.

The engaging body 17 can engage with the duct rail engaging part 47 of the duct rail 40.

Specifically, as illustrated in FIGS. 15A and 15B, the planar light source 10 has the slide plate 13 provided to the engaging part 4 so as the electrode terminals 11 and 12 not to be exposed when the engaging part 4 is not engaged.

The planar light source 10 is such that, when the duct rail 40 is in the non-engaged state with the engaging part 4, the slide plate 13 is positioned at a non-engaged position to be in contact with the electrode terminals 11 and 12 and thereby keep the electrode terminal springs 14 and 14 connected to the electrode terminals 11 and 12 contracted.

Figure 16A:
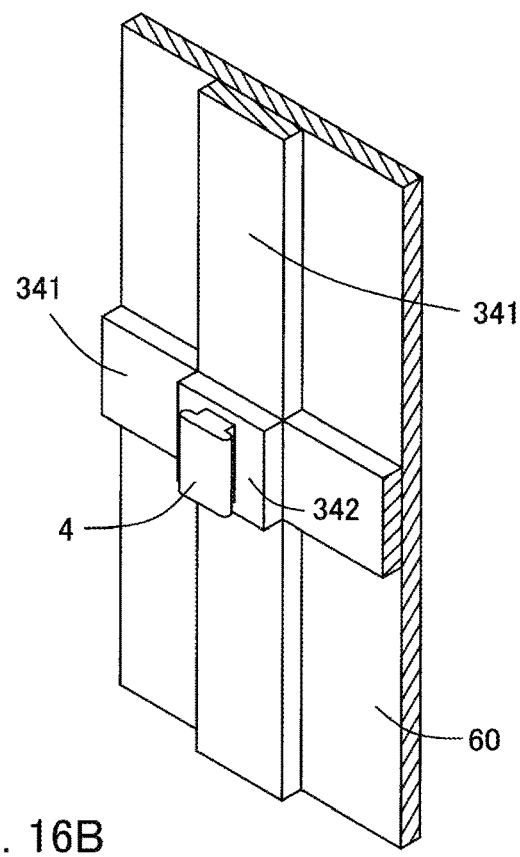
Figure 16B:
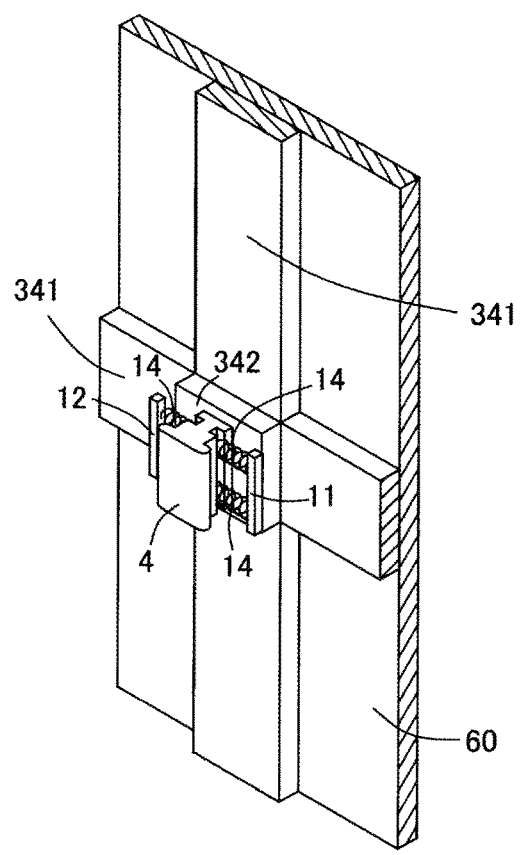

The planar light source 10 is such that, when the engaging part 4 is inserted in the duct rail 40 to engage with the duct rail 40, the slide plate 13 is pushed by, for example, a portion of the rail 42 of the duct rail 40 to move to the engaged position. This motion contracts the slide plate spring 15 connected to the slide plate 13 and releases the electrode terminal spring 14 from the contracted state as illustrated in FIGS. 16A and 16B. The mechanism uses the expanding force of the electrode terminal spring 14 to make the electrode terminals 11 and 12 project to contact the linear conductor 41 of the duct rail 40.

In summary, in the non-engaged state, namely, when the engaging part 4 is not attached to the duct rail 40, the electrode terminals 11 and 12 are covered by the slide plates 13 and 13 and kept urged outward by the electrode terminal spring 14.

Meanwhile, in the engaged state, namely, when the engaging part 4 is attached to the duct rail 40, the slide plates 13 and 13 are moved to the rear side to release the electrode terminals 11 and 12, and the electrode terminals 11 and 12 are urged to the linear conductor 41 by the electrode terminal spring 14.

(Mounting Surface 400)

The mounting surface 400 is a wall surface of a wall or a structure that has at least a vertical direction component. The mounting surface 400 is a vertical wall surface perpendicularly rising from a floor surface.

Now, the positional relationship among the members of the lighting system 100 in the OFF state will be described.

The engaging parts 4a and 4b are inserted in the gaps 50 and 50 of the duct rails 401 and 402, and the electrode terminals 11 and 12 of the engaging parts 4a and 4b push and make contact with the linear conductors 41a and 41b. That is, the linear conductors 41a and 41b and the electrode terminals 11 and 12 are electrically connected.

Specifically, as the engaging parts 4a and 4b contact the rails 42a and 42b, the slide plates 13 and 13 slide to the rear side, and the electrode terminal springs 14 and 14 urge the electrode terminals 11 and 12 to the linear conductors 41a and 41b.

The connecting unit 34 is such that the plunger A3 is housed inside the connecting unit body A1, and portions of the movable contact plates A5 and A5 and the contact metal pieces A6 and A6 are inserted in the plunger space A3B of the plunger A3.

The contact metal piece A6 is electrically connected to the movable contact terminal A5A via the contact metal piece middle section A6C in direct contact with the movable contact terminal A5A. The contact metal piece A6 has the movable contact spring section A6A that presses with a restoring force the outer face of the fixed contact terminal plate A2, and the leaf spring section A6B that presses with a restoring force the leaf spring contact portion A8C of the pin A8.

The pin A8 is integrated with the plunger A3 by the hole-insertion portion A8A, which is one end of the pin A8, inserted in the plunger pin supporting hole A3A of the plunger A3. The heart cam groove contact tip A8B, which is the other end of the pin A8, is inserted in the heart cam groove A4, provided in each of the top and bottom plates A1B, by the pressing force of the leaf spring section A6B.

The positional relationship among the members under on and off operations of the lighting system 100 made by a user will be described.

When a user presses the light-emitting surface 20 of the planar light source 10 against the urging force of the push switch springs A7 and A7, as illustrated in FIGS. 17A to 17D, the hole-insertion portion A8A of the pin A8, pressed by the pressing force, moves to the forward side along the descending sloped portion A4B of the heart cam groove A4 while the movable contact spring section A6A of the contact metal piece A6 moves along on the fixed contact terminal plate A2 toward the fixed contact terminal A9. The hole-insertion portion A8A comes to the flat portion A4D beyond the stepped portion A4C and the movable contact spring section A6A comes in contact with the fixed contact terminal A9, which creates an ON state in which the contact metal piece A6 is electrically connected to the fixed contact terminal A9.

When the user stops pressing, the hole-insertion portion A8A moves, by the restoring force of the push switch springs A7 and A7, along the flat portion A4D and goes beyond the stepped portion A4E. Then, the movable contact spring section A6A keeps contact with the fixed contact terminal A9 while moving, and when the hole-insertion portion A8A comes to the stepped portion A4E, the movable contact spring section A6A keeps contact with the fixed contact terminal A9.

When the user again presses the light-emitting surface 20 of the planar light source 10 against the urging force of the push switch springs A7 and A7, as illustrated in FIGS. 18A to 18D, the hole-insertion portion A8A moves by the pressing force to the forward side along the ascending sloped portion A4F and goes beyond the stepped portion A4G. Meanwhile, the movable contact spring section A6A moves along on the fixed contact terminal A9.

When the user stops pressing, the hole-insertion portion A8A moves, by the restoring force of the push switch springs A7 and A7, along the ascending sloped portion A4H and goes beyond the stepped portion A4I and comes to the proximal portion A4A. The movable contact spring section A6A is positioned away from the fixed contact terminal A9, and the movable contact spring section A6A is not in contact with the fixed contact terminal A9. That is, the contact metal piece A6 and the fixed contact terminal A9 are electrically isolated, which is the OFF state.

The lighting system 100 of the embodiment utilizes the features of the planar panel 60 that is small in thickness and emits planar light, and can be safely installed in a replaceable manner on the mounting surface 400, such as a wall, in a narrow space with excellent appearance. That is, the lighting system 100 of the embodiment is a novel, stylish, and familiar lighting system utilizing the features of the planar-light-emitting tile that is small in thickness and lightweight.

The lighting system 100 of the embodiment does not require a base portion to be provided on a back surface of an interior member. This allows installation of the panel with ease and with low cost as well as safe replacement with small chances of damage to the panel even for a panel small in thickness.

The lighting system 100 of the embodiment is free of complexity of adjusting the relation between the switches and panel arrangement and allows operations, such as turning on and off the panel, even for a case in which a plurality of panels is arranged.

The lighting system 100 of the present embodiment is a stylish and familiar lighting system that allows changing the mounting position of the planar light source 10 on the duct rail 40 along the longitudinal direction of the duct rail 40.

Although the lighting system 100 of the embodiment described above is mounted on a wall, the present invention is not limited to such a configuration. The duct rail 40 may be mounted on a ceiling, on a floor, or on a structure such as a desk.

In the embodiment described above, the planar light source 10 is fixed by the two duct rails 40. However, the present invention is not limited to such a configuration. The planar light source 10 may be fixed by a single duct rail 40 or by three or more duct rails 40.

Figure 19:
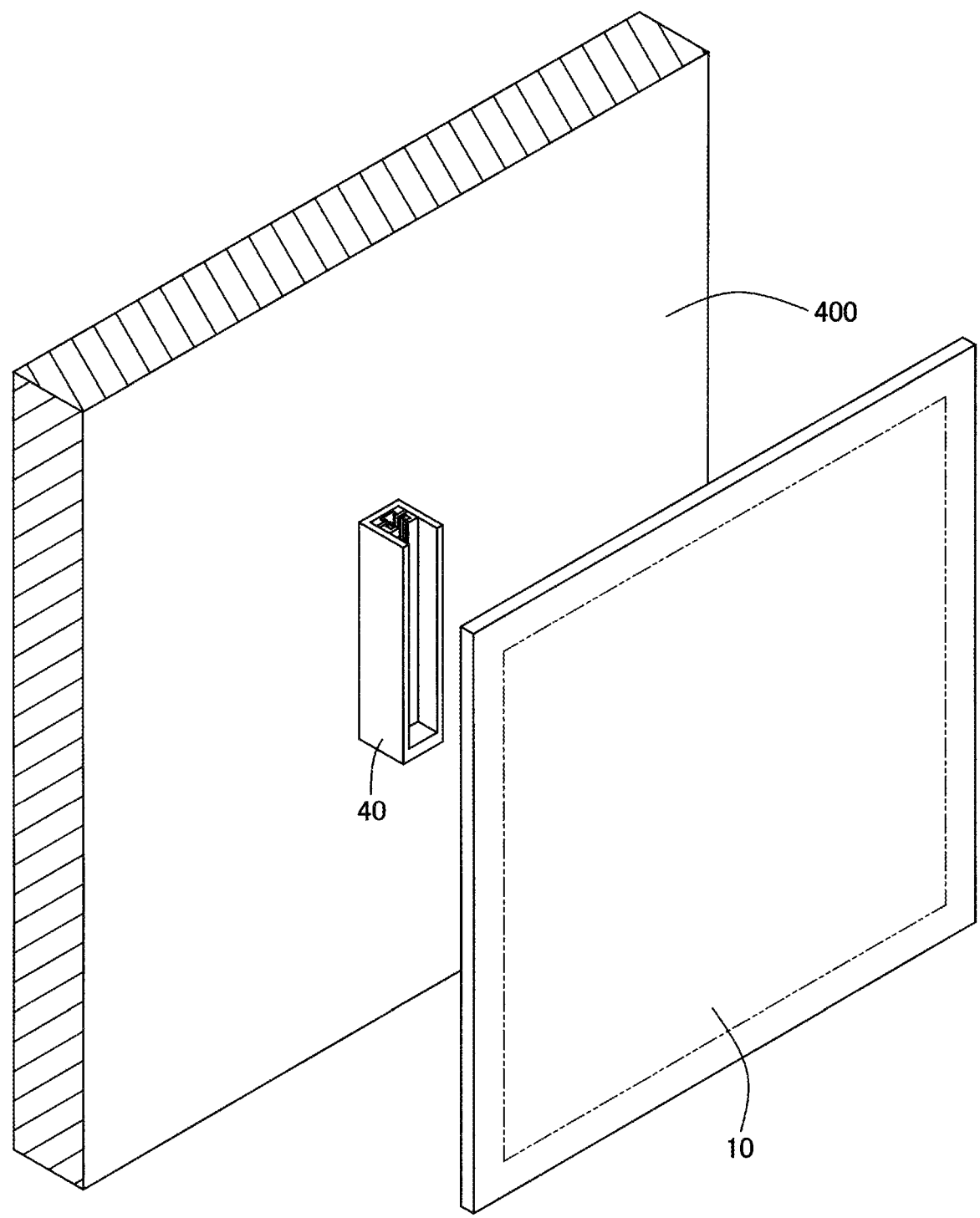
FIG. 19 is a perspective view of a lighting system according to another embodiment of the present invention.

In the embodiment described above, a portion of the duct rail 40 projects from the planar light source 10 in a front view. However, the present invention is not limited to such a configuration. As illustrated in FIG. 19, the duct rail 40 may be hidden behind the planar light source 10 in a front view.

Although the embodiment is described for a case where two electrode terminals 11 and 12 are provided for one engaging part 4, the present invention is not limited to such a configuration. As long as power can be supplied from the duct rail 40 to the planar-light-emitting element 1 as a whole, only one electrode terminal or three or more electrode terminals may be provided for each engaging part 4.

The embodiment is described for a case where the planar light source 10 is attached to a pair of duct rails 401 and 402 with anode terminals 11 and 12 provided on one engaging part 4a and cathode terminals 11 and 12 provided on the engaging part 4b. However, the present invention is not limited to such a configuration.

Figure 20:
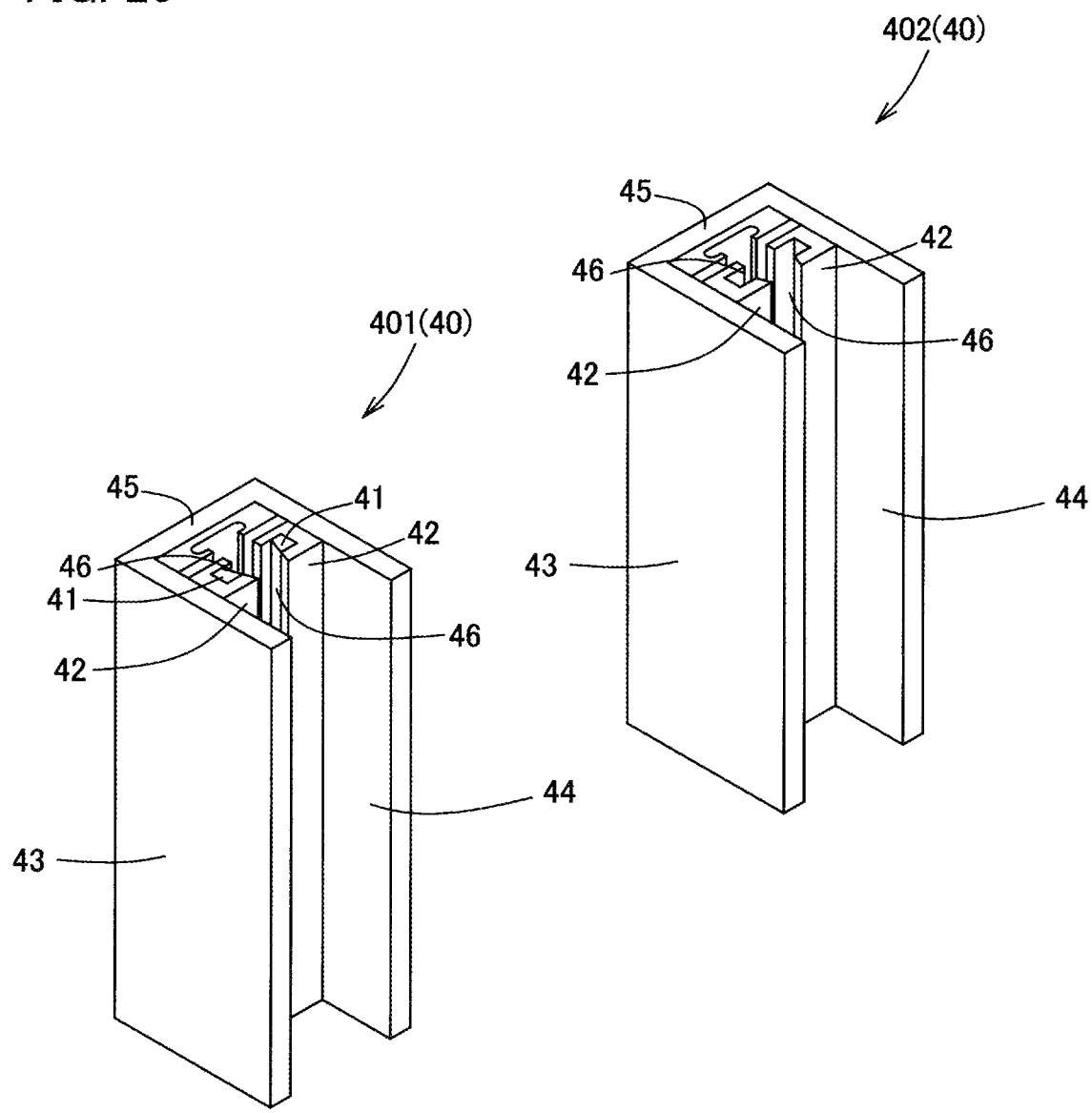
FIG. 20 is a perspective view of a duct rail according to another embodiment of the present invention.

As long as power can be supplied from the duct rail 40 to the target planar-light-emitting element 1 as a whole, the linear conductors 41a and 41b having two different polarities may be provided on one duct rail 401, and the anode terminal 11 and the cathode terminal 12 may be provided in the corresponding engaging part 4a, as illustrated in FIG. 20. In this case, the duct rail 402 needs not be provided with the linear conductors 41a and 41b.

In addition, the planar light source 10 may be supported by a single duct rail 40 or alternatively, three or more duct rails 40.

Figure 21:
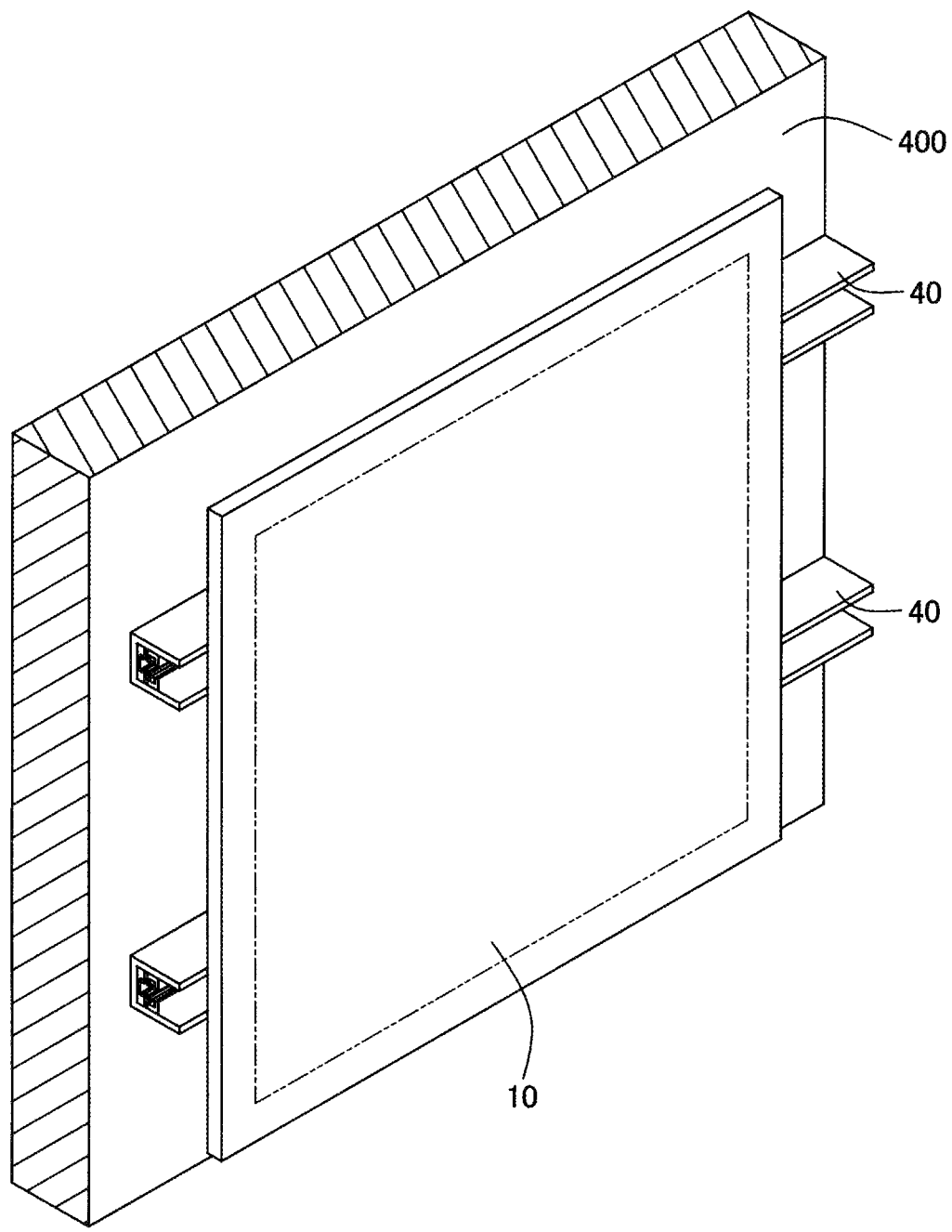
FIG. 21 is a perspective view of a lighting system according to another embodiment of the present invention.

In the embodiment described above, the duct rail 40 extends in the up-down direction. However, the present invention is not limited to such a configuration. The duct rail 40 may extend in other directions in which the mounting surface 400 extends, for example, in the left-right direction as illustrated in FIG. 21.

In the embodiment described above, the planar light source 10 having a quadrangular shape in a front view is illustrated. However, the present invention is not limited to such a configuration. The front shape of the planar light source 10 is not particularly limited. For example, the front shape of the planar light source 10 may be a polygonal shape other than a quadrangular shape, such as a triangle or a hexagon, or may be a shape having an outer shape including a curve such as a circle or an ellipse.

Although the embodiment described above employs the organic EL tile as the planar-light-emitting tile 3, the present invention is not limited to such a configuration. An LED tile in which LEDs are scattered on a surface may be employed as the planar-light-emitting tile 3.

Although the embodiment described above is illustrated such that the light-emitting surface 20 constitutes the push switch surface, and the lighting state and the non-lighting state are switched by pushing the light-emitting surface 20, the present invention is not limited to such a configuration. The output of the planar light may be adjusted in a stepwise or non-stepwise manner by pressing the light-emitting surface 20.

EXPLANATION OF REFERENCE CHARACTERS

1: planar-light-emitting element (planar arrangement LED element, organic EL element)
4: engaging part (detachable portion)
4a: engaging part (first detachable portion)
4b: engaging part (second detachable portion)
10: planar-light-emitting light source
100: light-emitting surface push switch lighting system
11: first electrode terminal
12: second electrode terminal
13: slide plate
14: electrode terminal spring
15: slide plate spring
2: light-emitting region
3: planar-light-emitting tile (organic EL tile)
34: connecting unit
341: tile terminal surface protective member
342: push switch member
4: engaging part
40: duct rail (mounting member)
41: linear conductor (conductive member)
42: rail
43: first engaging part holding plate
44: second engaging part holding plate
45: side plate
5: glass substrate
6: translucent plate
60: planar-light-emitting panel (organic EL panel)
7: translucent conductive film layer
8: organic functional film layer
9: reflective conductive film layer
400: mounting surface
A1: connecting unit body
A1A: engaging part mounting plate
A1B: top and bottom plate
A1C: left and right plate
A2: fixed contact terminal plate
A3: plunger
A3A: plunger pin supporting hole
A3B: plunger space
A4: heart cam groove
A5: movable contact plate (tile terminal surface protective member 341)
A5A: movable contact terminal
A6: contact metal piece
A6A: movable contact spring section
A6B: leaf spring section
A7: push switch spring
A8: pin
A8A: hole-insertion portion
A8B: heart cam groove contact tip
A8C: leaf spring contact portion
A9: fixed contact terminal

The invention claimed is:

1. A lighting system comprising:
a mounting member attachable to a mounting surface; and
a planar light source detachably attached to the mounting member, the planar light source being supplied with power from the mounting member to emit planar light,
wherein the planar light source comprises:
an engaging part engageable with a portion of the mounting member;
a planar-light-emitting panel having a light-emitting surface that emits the planar light; and
a connecting unit disposed between the engaging part and the planar-light-emitting panel,
the engaging part constituting a portion of a power supply path for supplying power from the mounting member to the planar-light-emitting panel,
the planar-light-emitting panel including a planar-light-emitting tile and a translucent plate that protects the planar-light-emitting tile,
one main surface of the planar-light-emitting tile including a light-emitting region,
wherein the planar-light-emitting panel, in a lighting state, emits the planar light from the light-emitting region of the planar-light-emitting tile through the translucent plate,
wherein an output of the planar light from the planar light source is adjusted by pushing the light-emitting surface,
wherein the mounting member comprises at least two duct rails extending in a predetermined direction,
wherein the planar light source, in a state attached to the mounting member, is movable in an extending direction of the duct rail,
wherein the connecting unit comprises a push switch member including a pair of switch mechanisms disposed to oppose to each other, the pair of switch mechanisms being disposed in a direction perpendicular to the light-emitting surface,
wherein the pair of switch mechanisms are configured to be electrically connected in the lighting state and are configured to be electrically disconnected in a non-lighting state, and
wherein the planar light source includes a first detachable portion detachable from one of the two duct rails and a second detachable portion detachable from the other of the two duct rails, and wherein the first detachable portion is the engaging part or wherein the first detachable portion and the second detachable portion constitute the engaging part.

2. The lighting system according to claim 1, wherein switching between the lighting state and the non-lighting state of the planar-light-emitting panel is made by pressing the light-emitting surface.

3. The lighting system according to claim 1,
wherein the mounting surface comprises at least a vertical direction component, and
wherein the two duct rails are fixed to the mounting surface parallel to each other.

4. The lighting system according to claim 1, wherein the light-emitting surface has, in the non-lighting state, appearance of a mirror surface.

5. The lighting system according to claim 1,
wherein the push switch member is capable of an alternate-action, and
wherein the planar light source is brought into the lighting state or the non-lighting state by giving a predetermined pressing force to the light-emitting surface, and keeps the lighting state or the non-lighting state after releasing the pressing force.

6. The lighting system according to claim 1,
wherein the connecting unit includes a protective member and the push switch member, the protective member being disposed closer to the planar-light-emitting panel,
wherein the protective member protects an other main surface of the planar-light-emitting tile, the protective member including two movable contact plates that oppose to each other and that are perpendicular to the light-emitting surface,
wherein the two movable contact plates extend with a vertical direction component, and
wherein the two movable contact plates are both fitted in the push switch member in the lighting state.

7. The lighting system according to claim 1, wherein the planar-light-emitting panel is an organic EL panel including an organic EL element in which an organic light-emitting layer is disposed between two opposing electrode layers.

* * * * *